| (12) | United States Patent | (10) Patent No.: | US 9,478,543 B2 |
|---|---|---|---|
| | Yamaji | (45) Date of Patent: | Oct. 25, 2016 |

(54) SEMICONDUCTOR INTEGRATED CIRCUIT

(71) Applicant: FUJI ELECTRIC CO., LTD., Kawasaki-shi (JP)

(72) Inventor: Masaharu Yamaji, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/692,171

(22) Filed: Apr. 21, 2015

(65) Prior Publication Data

US 2015/0364470 A1    Dec. 17, 2015

(30) Foreign Application Priority Data

Jun. 16, 2014    (JP) ................................ 2014-123865

(51) Int. Cl.
     *H01L 27/092*      (2006.01)
     *H01L 21/761*      (2006.01)
     *H01L 21/8238*      (2006.01)

(52) U.S. Cl.
     CPC ......... *H01L 27/0921* (2013.01); *H01L 21/761* (2013.01); *H01L 21/823892* (2013.01)

(58) Field of Classification Search
     CPC ........... H01L 27/0921; H01L 27/0922; H01L 27/0928
     See application file for complete search history.

(56) References Cited

U.S. PATENT DOCUMENTS

| 6,597,550 B1 | 7/2003 | Chey et al. | |
|---|---|---|---|
| 8,558,349 B2 * | 10/2013 | Chiang ............... | H01L 27/0629 257/300 |
| 8,633,563 B2 * | 1/2014 | Yamaji ................. | H01L 21/761 257/499 |
| 8,841,744 B2 * | 9/2014 | Imai ..................... | H01L 27/0248 257/491 |
| 2009/0085117 A1 | 4/2009 | Harada et al. | |
| 2013/0001736 A1 * | 1/2013 | Yamaji .............. | H01L 21/82348 257/499 |
| 2013/0127524 A1 * | 5/2013 | Yamaji ................. | H01L 21/761 327/537 |

FOREIGN PATENT DOCUMENTS

| JP | 2001-025235 A | 1/2001 |
|---|---|---|
| JP | 3346763 B2 | 11/2002 |
| JP | 2008-301160 A | 12/2008 |
| JP | 5072043 B2 | 11/2012 |
| JP | 5099282 B1 | 12/2012 |

* cited by examiner

*Primary Examiner* — Christine Enad

(74) *Attorney, Agent, or Firm* — Rabin & Berdo, P.C.

(57) ABSTRACT

A low side control circuit and a high side control circuit are disposed in first and second n type well regions, respectively. A third n⁻ type well region is formed around the second n type well region. The first n⁻ type well region is formed outside the second n⁻ type well region. A p type well region is formed around the third n⁻ type well region. The third n⁻ type well region and the p type well region constitute an HVJT between the first and second n type well regions. A p⁺ type contact region and a first electrode supplied with GND potential are formed in the p type well region. In the p type well region, an n⁺ type contact region and a second electrode supplied with L-VDD potential higher than the GND potential are formed between the HVJT and the p⁺ type contact region.

14 Claims, 11 Drawing Sheets

SEMICONDUCTOR INTEGRATED CIRCUIT

BACKGROUND OF THE INVENTION

1. Field of the Invention

The present invention relates to a semiconductor integrated circuit.

2. Description of the Related Art

An HVIC (High Voltage Integrated Circuit) has been well known as a semiconductor integrated circuit which drives and turns ON/OFF a switching power device constituting an upper arm of a bridge circuit for power reverse conversion (DC-to-AC conversion) of a PWM (Pulse Width Modulation) inverter etc. Recently, an element separation type HVIC which does not perform potential insulation by means of a transformer, a photocoupler, etc. but uses high voltage junction has been used in order to enhance a function to perform overcurrent detection and temperature detection when the switching power device is abnormal and in order to reduce the size and cost of a power supply system.

An HVIC which drives IGBTs (Insulated Gate Bipolar Transistors) used as switching power devices constituting a power conversion device such as an inverter will be used as an example to describe the connection configuration of the HVIC according to the related art. FIG. 7 is a circuit diagram showing the connection configuration of the high voltage integrated circuit. A power conversion device including a half-bridge circuit in which two switching power devices (IGBTs 114 and 115) are connected in series is shown in FIG. 7.

The power conversion device shown in FIG. 7 includes an HVIC, low voltage power supplies 112 and 113, IGBTs 114 and 115, and FWDs (Free Wheel Diodes) 116 and 117, an L-load (inductive load) 118, and a capacitor 119. In the power conversion device, the IGBT 115 serving as an upper arm of the half-bridge circuit and the IGBT 114 serving as a lower arm of the half-bridge circuit are turned ON alternately, so that high potential or low potential can be outputted alternately from a Vs terminal 111 serving as an output terminal. Thus, AC power can be supplied to (made to flow into) the L-load 118.

That is, the HVIC is a drive element which complementarily turns ON/OFF of the IGBT 115 as the upper arm of the half-bridge circuit and the IGBT 114 as the lower arm of the half-bridge circuit. For outputting high potential from the Vs terminal 111, the IGBTs 114 and 115 are operated by the HVIC so that the IGBT 115 as the upper arm can turn ON and the IGBT 114 as the lower arm can turn OFF. On the other hand, for outputting low potential from the Vs terminal 111, the IGBTs 114 and 115 are operated by the HVIC so that the IGBT 115 as the upper arm can turn OFF and the IGBT 114 as the lower arm can turn ON.

The HVIC includes a low side circuit (hereinafter referred to as low side control circuit: not shown) using potential of the GND (ground potential) as a reference. During the operating time of the HVIC, the low side control circuit outputs a gate signal for the IGBT 114 of the lower arm from an L-OUT. In addition, the HVIC outputs a gate signal for the IGBT 115 of the upper arm from an H-OUT using the potential of the Vs terminal 111 as a reference. The HVIC includes a level shift function (level shift circuit (level-up circuit and level-down circuit): not shown) for performing signal transmission between the low side control circuit and a high side circuit (hereinafter referred to as high side control circuit: not shown) in order to output the gate signal for the IGBT 115 of the upper arm from the H-OUT using the potential of the Vs terminal 111 as a reference.

The level-up circuit raises a logic level of an input signal inputted from an H-IN to generate a gate signal for the IGBT 115. The level-down circuit receives an abnormality signal 110 indicating abnormality such as overheating or overcurrent from the IGBT 115, forms an alarm signal based on the abnormality signal 110 and reduces the level of the alarm signal. The low side control circuit is connected to the H-IN. The low side control circuit outputs an input signal to the level-up circuit. The H-IN is an input terminal which receives an input of an input signal to be transmitted to a low side circuit which is disposed in a front stage of the level-up circuit.

An output terminal of the high side control circuit is connected to the H-OUT. The H-OUT is connected to a gate of the IGBT 115 of the upper arm. The H-OUT is an output terminal which supplies a gate signal to the IGBT 115. The low side control circuit is connected to an L-IN. The L-IN is an input terminal which receives an input of an input signal in order to supply a gate signal to the IGBT 114. The L-OUT is connected to a gate of the IGBT 114 of the lower arm which is disposed in a rear stage of the HVIC. The L-OUT is an output terminal which supplies a gate single to the IGBT 114.

An ALM-IN indicates an input of the abnormality signal 110. The abnormality signal 110 is inputted to a detection circuit (not shown) which forms an alarm signal based on the abnormality signal 110. The low side control circuit is connected to an ALM-OUT. The ALM-OUT is an output terminal which outputs an alarm signal whose level has been reduced by the level-down circuit. An H-VDD is a terminal which connects a high potential side of the low voltage power supply 113 using potential of a Vs as a reference. An L-VDD is a terminal which connects a high potential side of the low voltage power supply 112 using the potential of the GND as a reference.

The Vs is a terminal of intermediate potential (floating potential) fluctuating in the range of from potential of a high potential side Vss of a high voltage power supply (main circuit power supply) to the potential of the GND. The Vs is connected to the Vs terminal 111. The GND is a ground (earth) terminal. The low voltage power supply 112 is a low side drive power supply which is connected between the L-VDD of the HVIC and the GND. The low voltage power supply 113 is a high side drive power supply which is connected between the H-VDD and the Vs of the HVIC. An emitter of the IGBT 114 is connected to the GND serving as a low potential side of the high voltage power supply. A collector of the IGBT 114 is connected to an emitter of the IGBT 115. A collector of the IGBT 115 is connected to the high potential side Vss of the high voltage power supply.

In addition, the FWDs 116 and 117 are connected in reverse parallel to the IGBTs 114 and 115 respectively. A connection point between the collector of the IGBT 114 and the emitter of the IGBT 115 (that is, an output terminal of the half-bridge circuit) is connected to the Vs terminal 111. The Vs of the HVIC and the L-load 118 are connected to the Vs terminal 111. The L-load 118 is AC resistance (reactance) of, for example, a motor or an illuminator, etc. which operates using the bridge circuit configured to have a combination of the half-bridge circuit (IGBTs 114 and 115). The capacitor 119 is connected between the L-VDD and the GND.

Next, the level shift circuit (the level-up circuit and the level-down circuit) of the HVIC will be described. FIG. 8 is a circuit diagram showing the configuration of the level-up circuit. FIG. 9 is a circuit diagram showing the configuration of the level-down circuit. In each of FIGS. 8 and 9, a CMOS circuit which transmits an input signal to the level shift circuit and a CMOS circuit which transmits an output signal of the level shift circuit to a rear stage are shown as peripheral circuits of the level shift circuit. An H-IN, an H-OUT, an ALM-IN, an ALM-OUT, an H-VDD, an L-VDD, a Vs and the GND in FIGS. 8 and 9 correspond to the H-IN, the H-OUT, the ALM-IN, the ALM-OUT, the H-VDD, the L-VDD, the Vs and the GND shown in FIG. 7, respectively.

A level-up circuit 210 shown in FIG. 8 includes an n-channel type MOSFET (Metal Oxide Semiconductor Field Effect Transistor) 211, a level shift resistor 212, and a diode 213. The level-up circuit 210 is required when the IGBT 115 of the upper arm of the half-bridge circuit is an n-channel type. A drain of the n-channel MOSFET 211 is connected to one end of the level shift resistor 212 and a source of the n-channel MOSFET 211 is grounded. A body diode 214 which is connected in reverse parallel to the n-channel MOSFET 211 is built in the n-channel MOSFET 211. A connection point between the n-channel MOSFET 211 and the level shift resistor 212 is an output unit 215 of the level-up circuit 210.

The other end of the level shift resistor 212 is connected to the H-VDD. The diode 213 is connected in parallel to the level shift resistor 212. The diode 213 is disposed in order to prevent the level shift resistor 212 from being broken or to protectively clamp the CMOS circuit of a high side circuit 217 in a rear stage when the potential of the H-VDD is remarkably lower than the potential of the GND (when an excessively negative surge voltage (hereinafter referred to as negative surge voltage) is applied). In addition, the diode 213 has a function to prevent an excessive voltage from being applied to a gate of the CMOS circuit of the high side circuit 217 which will be described later, when the overvoltage is applied to the H-VDD during an ON-operation of the n-channel MOSFET 211. A Zener diode is typically often used as the diode 213.

A low side circuit 216 and the high side circuit 217 are provided as peripheral circuits of the level-up circuit 210. The low side circuit 216 is disposed within the low side control circuit and in a front stage of the level-up circuit 210. The high side circuit 217 is disposed within the high side control circuit and in a rear stage of the level-up circuit 210. Each of the low side circuit 216 and the high side circuit 217 has a CMOS circuit in which a p-channel MOSFET (PMOS) and an n-channel MOSFET (NMOS) are connected to complement each other. A gate of the CMOS circuit of the low side circuit 216 is connected to the H-IN to receive an input of an input signal transmitted from the outside. In the CMOS circuit of the low side circuit 216, a source of the p-channel MOSFET is connected to the L-VDD and a source of the n-channel MOSFET is grounded. Incidentally, each of the low side circuit 216 and the high side circuit 217 may have another transmission circuit than the CMOS circuit.

A connection point (output terminal) between the p-channel MOSFET and the n-channel MOSFET which constitute the CMOS circuit of the low side circuit 216 is connected to a gate of the n-channel MOSFET 211 to transmit an input signal to the level-up circuit 210. A gate of the CMOS circuit of the high side circuit 217 is connected to the output unit 215 of the level-up circuit 210 to receive the input of the input signal transmitted from the level-up circuit 210. In the CMOS circuit (hereinafter referred to as second CMOS circuit) of the high side circuit 217, a source of a p-channel MOSFET (hereinafter referred to as second p-channel MOSFET) 130a is connected to the H-VDD and a source of an n-channel MOSFET (hereinafter referred to as second n-channel MOSFET) 130b is connected to the Vs. A connection point between the second p-channel MOSFET 130a and the second n-channel MOSFET 130b which constitute the CMOS circuit of the high side circuit 217 is connected to the H-OUT to transmit an input signal to the HVIC.

In the level-up circuit 210 configured thus, an input signal inputted from the H-IN to the gate of the CMOS circuit of the low side circuit 216 is inputted to the gate of the n-channel MOSFET 211 of the level-up circuit 210 via the CMOS circuit of the low side circuit 216. Upon reception of the input of the input signal, the n-channel MOSFET 211 turns ON/OFF so that an output signal can be outputted from the output unit 215 of the level-up circuit 210 and inputted to the gate of the CMOS circuit of the high side circuit 217. Upon reception of the input of the input signal, the CMOS circuit of the high side circuit 217 turns ON/OFF so that an output signal (a signal whose level has been raised by the level-up circuit 210) of the CMOS circuit of the high side circuit 217 can be outputted from the H-OUT. The output signal is converted into a signal using the potential of the Vs terminal 111 as a reference, and inputted to the gate of the IGBT 115 of the upper arm. Upon reception of the input of the input signal, the IGBT 115 of the upper arm of the half-bridge circuit turns ON/OFF.

As shown in FIG. 9, the level-down circuit 220 includes a p-channel MOSFET 221, a level shift resistor 222, and a diode 223. A drain of the p-channel MOSFET 221 is connected to one end of the level shift resistor 222, and a source of the p-channel MOSFET 221 is connected to the H-VDD. A body diode 224 which is connected in reverse parallel to the p-channel MOSFET 221 is built in the p-channel MOSFET 221. A connection point between the p-channel MOSFET 221 and the level shift resistor 222 is an output unit 225 of the level-down circuit 220.

The other end of the level shift resistor 222 is grounded. The diode 223 is connected in parallel to the level shift resistor 222. The diode 223 has a function to prevent the level shift resistor 222 from being damaged when the potential of the H-VDD is remarkably lower than the potential of the GND. In addition, the diode 223 has a function to prevent an overvoltage from being applied to a gate of the CMOS circuit of a low side circuit 227 which will be described later, when the overvoltage is applied to the H-VDD during an ON-operation of the p-channel MOSFET 221.

A high side circuit 226 and the low side circuit 227 are provided as peripheral circuits of the level-down circuit 220. The high side circuit 226 is disposed within the high side control circuit and in a front stage of the level-down circuit 220. The low side circuit 227 is disposed within the low side control circuit and in a rear stage of the level-down circuit 220. Each of the high side circuit 226 and the low side circuit 227 has a CMOS circuit in which a p-channel MOSFET (PMOS) and an n-channel MOSFET (NMOS) are connected to complement each other. A gate of the CMOS circuit of the high side circuit 226 receives an input of an alarm signal formed based on an abnormality signal 110. In the CMOS circuit of the high side circuit 226, a source of the p-channel MOSFET is connected to the H-VDD and a source of the n-channel MOSFET is connected to the Vs. Incidentally, each of the low side circuit 227 and the high side circuit 226 may have another transmission circuit than the CMOS circuit.

A connection point (output terminal) between the p-channel MOSFET and the n-channel MOSFET which constitute the CMOS circuit of the high side circuit 226 is connected to a gate of the n-channel MOSFET 221 to transmit an input signal to the level-down circuit 220. A gate of the CMOS circuit of the low side circuit 227 is connected to the output 225 of the level-down circuit 220 to receive the input of the input signal transmitted from the level-down circuit 220. In the CMOS circuit of the low side circuit 227, a source of the p-channel MOSFET is connected to the L-VDD and a source of the n-channel MOSFET is grounded. A connection point between the p-channel MOSFET and the n-channel MOSFET which constitute the CMOS circuit of the low side circuit 227 is connected to the ALM-OUT to output an output signal to the outside from the ALM-OUT.

In the level-down circuit 220 configured thus, an alarm signal based on the abnormality signal 110 and inputted to the gate of the CMOS circuit of the high side circuit 226 is inputted to the gate of the p-channel MOSFET 221 of the level-down circuit 220 via the CMOS circuit of the high side circuit 226. Upon reception of the input of the input signal, the p-channel MOSFET 221 turns ON/OFF so that an output signal can be outputted from the output unit 225 of the level-down circuit 220 and inputted to the gate of the CMOS circuit of the low side circuit 227. Upon reception of the input of the input signal, the CMOS circuit of the low side circuit 227 turns ON/OFF so that an output signal (an alarm signal whose level has been reduced by the level-down circuit 220) of the CMOS circuit of the low side circuit 227 can be outputted from the ALM-OUT.

Next, the sectional structure of an HVIC according to the related art will be described with reference to FIGS. 7 to 10. FIG. 10 is a sectional view showing the structure of a high voltage integrated circuit (HVIC) according to the related art. FIG. 10 shows a logic portion of a low side control circuit 181, a logic portion of a high side control circuit 182, and a main part of an HVJT (High Voltage Junction Terminal region) 183, of respective constituent portions of a self-isolation type HVIC 180. An arrow continued from a right side of the sectional view illustrated in an upper side of FIG. 10 to a left side of the sectional view illustrated in a lower side of FIG. 10 indicates that the sectional view illustrated in the upper side is connected to the sectional view illustrated in the lower side to thereby form one p-type semiconductor substrate 101 (semiconductor chip) (the same rule also applies to FIGS. 1, 3 to 6 and 11).

As shown in FIG. 10, in the HVIC 180 according to related art, n⁻ type well regions 102 and 104, an n type well region 103, and a p type well region 105 are respectively selectively provided in a front surface layer of a front surface of the p type semiconductor substrate 101 connected to the GND. The n⁻ type well region 104 surrounds the circumference of the n type well region 103. The n⁻ type well region 102 is provided outside the n⁻ type well region 104 (on an opposite side to the side of the n type well region 103). The p type well region 105 is provided between the n⁻ type well region 102 and the n⁻ type well region 104.

A first CMOS circuit (a p-channel MOSFET (hereinafter referred to as first p-channel MOSFET) 120a and an n-channel MOSFET (hereinafter referred to as first n-channel MOSFET) 120b) which outputs a gate signal to the IGBT 114 of the lower arm of the half-bridge circuit is disposed as the low side control circuit 181 in the n⁻ type well region 102. In addition, although not shown, the low side circuit 216 or 227 etc. serving as the peripheral circuit of the level shift circuit is disposed as the low side control circuit 181 in the n⁻ type well region 102.

The level shift circuit, the high side circuit 217 or 226 serving as the peripheral circuit of the level shift circuit, etc. are disposed as the high side control circuit 182 in the n type well region 103. FIG. 10 shows a second CMOS circuit (a second p-channel MOSFET 130a and a second n-channel MOSFET 130b) which constitutes a logic part of the high side circuit 217. The high side circuit 217 is a peripheral circuit of the level-up circuit 210. The n-channel MOSFET 211 constituting the level-up circuit 210 is disposed to extend from the n type well region 103 over to the n⁻ type well region 104 which serves as the HVJT 183 and the p type well region 105 which is adjacent to the n⁻ type well region 104.

The n-channel MOSFET 211 constituting the level-up circuit 210 includes the n type well region 103, the n⁻ type well region 104, the p type well region 105, n⁺ type regions 141, 144 and 161, a p⁺ type contact region 143, a gate electrode 148, a source electrode 145 and a drain electrode 162. The p type well region 105 serves as a base region. The n⁺ type region 144 serves as a source region. The n⁺ type region 161 serves as a drain region. The reference numerals 146 and 147 designate a pickup electrode and a p⁺ type contact region respectively. The reference numeral 142 designates a pickup electrode.

Specifically, the n⁺ type region 144 and the p⁺ type contact regions 143 and 147 are respectively selectively provided inside the p type well region 105. The n⁺ type region 141 is selectively provided inside the n type well region 103. The gate electrode 148 is provided, through a gate insulating film, on a front surface of a portion of the p type well region 105, which portion is interposed between the n⁺ type region 144 and the n⁺ type region 141 (an n type region including the n type well region 103 adjacent to the n⁺ type region 141 and the n⁻ type well region 104). The source electrode 145 is adjacent to the n⁺ type region 144 and the p⁺ type contact region 143.

The source electrode 145 is connected to the GND. The drain electrode 162 is adjacent to the n⁺ type region 161. In addition, the drain electrode 162 is connected to the level shift resistor 212 (not shown in FIG. 10) through a front surface metal wiring (not shown) and electrically connected to the H-VDD through the level shift resistor 212. In addition, a connection portion between the drain electrode 162 and the level shift resistor 212 is the output portion 215 of the level-up circuit 210. An output from the output portion 215 is low in potential when the n-channel MOSFET for level shift is ON, and high in potential when the n-channel MOSFET for level shift is OFF. Therefore, the HVIC 180 can perform a level shift operation which is to transmit a signal between different reference potentials.

The reference numerals 122 to 125 designate an n⁺ type contact region, a p⁺ type source region, a p⁺ type drain region and a gate electrode of the first p-channel MOSFET 120a respectively. The reference numerals 121 and 126 to 129 designate a p type offset region, an n⁺ type drain region, an n⁺ type source region, a p⁺ type contact region and a gate electrode of the first n-channel MOSFET 120b respectively. The reference numerals 132 to 135 designate an n⁺ type contact region, a p⁺ type source region, a p⁺ type drain region and a gate electrode of the second p-channel MOSFET 130a respectively. The reference numerals 131 and 136 to 139 designate a p type offset region, an n⁺ type drain region, an n⁺ type source region, a p⁺ type contact region and a gate electrode of the second n-channel MOSFET 130b respectively. An H-OUT, an L-OUT, an H-VDD, an L-VDD, a Vs and the GND in FIG. 10 are terminals corresponding to the H-OUT, the L-OUT, the H-VDD, the L-VDD, the Vs and the GND shown in FIG. 7 respectively.

A bridge circuit constituted by a combination of half-bridge circuits each consisting of switching power devices (IGBTs 114 and 115) using such an HVIC 180 as a drive element can be used broadly in lots of fields such as a power supply for use in a large-capacity plasma display panel (PDP), a liquid crystal panel, etc., an inverter for a consumer electrical appliance such as an air conditioner or an illuminator, in addition to an inverter for motor control. The motor or illuminator etc. corresponds to the L-load 118 as described above. Therefore, the HVIC 180 is adversely influenced by a parasitic inductance component etc. caused by a wiring on a printed circuit board, a cable up to the L-load 118, etc.

Specifically, when the IGBT 115 of the upper arm is switched OFF or when the IGBT 114 of the lower arm is switched ON, the potential of the Vs terminal 111 (the reference potential of the high side circuit 217 or 226) or the potential of the H-VDD (the potential using the potential of the Vs terminal 111 as a reference) fluctuates to negative potential side with respect to the potential (0V) of the GND due to the adverse influence of the parasitic inductance component etc. A negative surge voltage $V_{SO}$ which is negative in potential with respect to the potential of the GND is applied to the Vs terminal 111, for example, at a timing when the IGBT 115 of the upper arm is turned OFF. The negative surge voltage $V_{SO}$ can be calculated by use of the following expression (1). In the following expression (1), the reference sign $L_0$ designates an inductance value of the L-load 118; and the reference sign I designates a current value flowing into the IGBT 115.

$$V_{SO}=L_0 \times dI/dt \qquad (1)$$

When the negative surge voltage $V_{SO}$ applied to the Vs terminal 111 is lower than [potential of GND$-(V_{spy}+V_{fd})$], parasitic pn diodes 151 and 152 of the self-isolation type HVIC 180 (chip) start to be electrically conductive. The parasitic pn diode 151 includes the p type semiconductor substrate 101 and the n type well region 103. The parasitic pn diode 152 includes the p type well region 105 and the n⁻ type well region 104. The reference sign $V_{spy}$ designates a battery voltage between opposite ends of the low voltage power supply 113 serving as a high side drive power supply or between opposite ends of a not-shown bootstrap capacitor. The reference sign $V_{fd}$ designates a forward voltage drop at the parasitic pn diode 151 or 152.

When the potential of the Vs terminal 111 is largely pulled to the negative side, an overcurrent flows into the HVIC 180 (chip). As a result, there is a fear that malfunction or latch-up occurring in the high side control circuit constituting the HVIC 180 may lead to failure or breakdown in the HVIC 180. The negative surge voltage $V_{SO}$ applied to the Vs terminal 111 varies depending on the inductance value of the L-load 118 or the current flowing into the HVIC 180. The negative surge voltage $V_{SO}$ is about −20 V to about −100 V and the application period thereof is about several hundred ns to about 1 µs.

As such an HVIC, proposed is a circuit (for example, see Japanese Patent No. 3346763) including a resistor which is connected in series to a parasitic diode in an HVIC chip and disposed between a substrate of the HVIC chip and a ground potential terminal so as to limit a current in a negative voltage spike (negative surge) flowing into the parasitic diode of the HVIC due to a negative voltage transient phenomenon at an output node in order to protect the HVIC which drives a half-bridge type power transistor in anticipation of an excessive negative swing (application of a negative surge voltage) at the output node.

In addition, as another HVIC, proposed is a device in which a diode is inserted between a drain electrode of a switching element belonging to a level shift circuit and a gate electrode of an MOS transistor belonging to an amplifier (CMOS circuit) so as to reduce an adverse influence of a negative voltage (reverse bias) applied beyond a rated breakdown voltage (for example, see JP-A-2001-25235). In JP-A-2001-25235, a current reversely flowing into the switching element can prevent the adverse influence on the operation of the amplifier.

In addition, as a further HVIC, proposed is a device in which a level shift resistor, a current limiting resistor and a switching element (whose drain is on a high potential side) constituting a level-up circuit are connected in series between the high potential side and a low potential (ground potential) side of a high voltage power supply in the named order from the high potential side of the high voltage power supply, and an area between the level shift resistor and the current limiting resistor is set as an output of the level-up circuit (for example, see JP-A-2008-301160). In JP-A-2008-301160, the current limiting resistor is connected to a current path between a high potential side (H-VDD) and a low potential side (GND) of a low voltage power supply of the level shift circuit using the potential of a Vs terminal as a reference. Thus, a body diode of an n-channel MOSFET constituting the level-up circuit and a parasitic pn diode itself of the HVIC can be prevented from being breakdown due to an overcurrent, or any small current capacity portion of the level shift circuit can be prevented from being breakdown due to an overcurrent.

In addition, the following device is proposed as a further HVIC. An n type well region where a high side circuit is provided is provided in a front surface layer of a p type semiconductor substrate. A p type offset region for providing an n-channel MOSFET of a CMOS circuit constituting a logic portion of the high side circuit is provided inside the n type well region and a p⁺ type impurity region which is as high in potential as a Vs is provided adjacently to the p type offset region. Further, an n⁺ type impurity region and a p⁺ type impurity region which are as high in potential as an H-VDD are provided within the n type well region where the high side circuit is provided and in the periphery of the CMOS circuit constituting the logic portion of the high side circuit (for example, see Japanese Patent No. 5072043).

In Japanese Patent No. 5072043, the n⁺ type impurity region and the p⁺ type impurity region are provided in the n type well region constituting the high side circuit and these impurity regions are fixed to be as high in potential as the H-VDD or the Vs. Accordingly, a hole current flowing into the n type well region from the region which is as high in potential as the GND is absorbed before flowing into a p type well region. Thus, a parasitic operation caused by application of a negative surge voltage in the logic portion of the high side circuit using the potential of the Vs terminal as a reference can be prevented to avoid latch-up in a parasitic thyristor.

In addition, the following device is proposed as a further HVIC. An n type region serving as a high side floating potential region, an n⁻ type region serving as a high voltage junction terminal region, and an n type region serving as a low side power supply (L-VDD) potential region are provided in a front surface layer of a p type semiconductor substrate and a low side circuit is disposed in the low side power supply potential region. A universal contact region which forms an ohmic contact (an electric contact portion) with a pickup electrode is provided in the high voltage junction terminal region. The universal contact region has a configuration in which p⁺ type regions and n⁺ type regions are repeated alternately and arranged to be adjacent to each other along the front surface of the p type semiconductor substrate (for example, see Japanese Patent No. 5099282).

Japanese Patent No. 5099282 discloses that a pickup between the high potential n⁻ type region forming the HVJT (High Voltage Junction Terminal region) and the GND potential p type region is formed as a universal electrode in order to enhance an effect of extracting minority carriers toward the high side circuit or the low side circuit due to the parasitic diode operated when a negative surge voltage is applied. Thus, according to Japanese Patent No. 5099282, it is possible to reduce the amount of carriers flowing into the low side control circuit and prevent malfunction or breakdown due to latch-up in the logic portion of the low side control circuit when the negative surge voltage is applied to the HVIC.

However, the aforementioned HVIC according to the related art has the following problems. Description will be made by way of example in the case where the high potential side Vss of the high voltage power supply (main circuit power supply) is about 1,200 V and the potential of the H-VDD of the HVIC is higher than the potential of the Vs by about 20 V in the power conversion device in which the switching power devices (IGBTs 114 and 115) and the HVIC are connected to each other, as shown in FIG. 7. When the IGBT 115 of the upper arm of the half-bridge circuit turns ON and the IGBT 114 of the lower arm of the half-bridge circuit turns OFF, current flows toward the L-load 118 from the IGBT 115 of the upper arm.

When the IGBT 115 of the upper arm turns OFF in this state, the current flows from the GND into the L-load 118 via the FWD 116 which is connected in parallel to the IGBT 114 of the lower arm because the L-load 118 intends to maintain the current flowing into the power conversion device (the current phase with respect to the AC voltage delays due to the L-load 118). Thus, the potential of the Vs terminal 111 becomes lower than the potential of the GND, for example, to be about −100V. When the potential of the Vs terminal 111 reaches about −100V, the potential of the H-VDD is higher than the potential of the Vs by about 20V as described above. Accordingly, the potential of the H-VDD is about −80V (=−100V+20V).

In the structure of the HVIC 180 according to the related art as shown in FIG. 10, the p type semiconductor substrate 101 and the p type well region 105 are as high in potential as the GND. Therefore, when the potential of the Vs terminal 111 decreases until the n type well region 103 and the n⁻ type well region 104 constituting the CMOS circuit of the logic portion of the high side circuit 217 in the periphery of the level-up circuit 210 become lower in potential than the GND, the parasitic pn diode 151 or 152 is brought into a forward bias so that a large current flows. Due to the large current, the high side circuit 217 or 226 or the low side circuit 216 or 227 in the HVIC 180 malfunctions or breakdown due to latch-up.

As to the malfunction or the breakdown caused by the parasitic operation, a resistor for limiting a current is connected between the substrate and the ground terminal to suppress the amount of the current in Japanese Patent No. 3346763, which, however, has no suggestion about whether the resistor may be connected to any other place. In addition, since the resistor is formed as a polysilicon layer, there is a possibility for the polysilicon layer constituting the resistor may be thermally melted and breakdown by an overcurrent when a large pulse current (several ampere (A)–tens of ampere (A)) caused by a negative surge voltage flows into the parasitic diode between the Vs terminal and the ground terminal transiently.

JP-A-2001-25235 has no description about the body diode of the MOSFET constituting the level shift circuit or the resistor or layout for limiting the current of the parasitic pn diode of the HVIC when the potential of the H-VDD becomes negative due to the L-load. JP-A-2008-301160 has no description about how to prevent malfunction (incorrect inversion) caused by a parasitic operation of the CMOS circuit constituting the logic portion of the high side control circuit using the potential of the Vs terminal as a reference or the CMOS circuit constituting the logic portion of the low side control circuit using the potential of the GND as a reference. Japanese Patent No. 5072043 has no description about how to prevent malfunction caused by a parasitic operation of the CMOS circuit constituting the logic portion of the low side control circuit portion.

In addition, in Japanese Patent No. 5099282, the present inventor has mentioned about reduction of the amount of minority carriers injected into the high side control circuit or the low side control circuit portion. It is because, when the minority carriers are injected into the high side control circuit and/or the low side control circuit portion, in the HVIC, a malfunctions and/or breakdown due to latch-up occur caused by a parasitic operation of the CMOS circuit constituting the logic portion of the high side control circuit and/or the low side control circuit. Malfunction caused by a parasitic operation of one of the CMOS circuits constituting the logic portions of the low side control circuit 181 and the high side control circuit 182 of the HVIC 180 according to the related art will be described below.

FIG. 11 is an explanatory view showing behavior of electrons and holes when a negative surge voltage is applied to the high voltage integrated circuit in FIG. 10 via the H-VDD. The configuration of the level-up circuit (the n-channel MOSFET 211 in FIG. 8) is not shown in FIG. 11. When the negative surge voltage is applied to the H-VDD via the Vs terminal 111 (see FIG. 7), a forward current flows into the parasitic pn diode 152. On this occasion, minority carriers (electrons) are injected from the n type well region 104 serving as a cathode region of the parasitic pn diode 152 into the p type well region 105 serving as an anode region of the parasitic pn diode 152.

The electrons injected into the p type well region 105 are not substantially extracted from the p⁺ type contact region 143 provided inside the p type well region 105 but flow into the n⁻ type well region 102 adjacent to the outer side of the p type well region 105 (the outer circumferential side of the chip), and flow toward the n⁺ type contact region 122 inside the n⁻ type well region 102. The n⁺ type contact region 122 is, for example, about 15V higher in potential than the n⁻ type well region 102. In that process, a voltage drop occurs in a parasitic resistor 153 present inside the n⁻ type well region 102 in which the CMOS circuit (the first p-channel MOSFET 120a and the first n-channel MOSFET 120b) constituting the logic portion of the low side control circuit 181 is provided.

The potential of the n⁻ type well region 102 in the vicinity of the p⁺ type drain region 124 of the first p-channel MOSFET 120a is pulled down by the voltage drop of the parasitic resistor 153. As a result, a parasitic pnp bipolar transistor 154 turns ON. In the parasitic pnp bipolar transistor 154, the p⁺ type drain region 124 of the first p-channel MOSFET 120a constituting the logic portion in the low side control circuit 181 serves as an emitter, the n⁻ type well region 102 serves as a base, and the p type semiconductor substrate 101 serves as a collector. Therefore, there is a fear that malfunction such as inversion of the output logic of the L-OUT etc. may be caused or breakdown due to latch-up in the low side control circuit 181 may be caused.

On the other hand, minority carriers (holes) are injected from the p type well region 105 into the n⁻ type well region 104. The holes having entered the n⁻ type well region 104 flow into the n type well region 103, and further flow into the p⁺ type source region 133 and the p⁺ type drain region 134 of the second p-channel MOSFET 130a constituting the logic portion of the high side control circuit 182, or further flow into the p type offset region 131 in which the second n-channel MOSFET 130b is provided. Thus, a parasitic npn transistor (not shown) turns ON. In the parasitic npn transistor, the n⁺ type source region 137 of the second n-channel MOSFET 130b serves as an emitter, the p type offset region 131 serves as a base, and the n type well region 103 serves as a collector. Therefore, there is a fear that malfunction or breakdown due to latch-up may occur in the logic portion of the high side control circuit 182.

SUMMARY OF THE INVENTION

In order to solve the aforementioned problem inherent in the related art, an object of the invention is to provide a high voltage integrated circuit which can prevent malfunction or breakdown.

In order to solve the aforementioned problem and achieve the object of the invention, a semiconductor integrated circuit according to one aspect of the invention has the following characteristics. That is, a first second-conductivity-type well region is formed on one main surface side of a first-conductivity-type semiconductor substrate. A second second-conductivity-type well region is formed on the one main surface side of the semiconductor substrate and separately from the first second-conductivity-type well region. A first circuit is formed in the first second-conductivity-type well region. The first circuit is supplied with second potential higher than first potential, and the second potential is supplied from a first low voltage power supply using the first potential as a reference. A second circuit is formed in the second second-conductivity-type well region. The second circuit is supplied with fourth potential higher than third potential, and the fourth potential is supplied from a second low voltage power supply using the third potential as a reference. A first-conductivity-type well region is formed adjacent to and around the second second-conductivity-type well region. The first-conductivity-type well region is adjacent to the semiconductor substrate. A first-conductivity-type semiconductor region is selectively formed inside the first-conductivity-type well region. A first electrode which is supplied with the first potential is adjacent to the first-conductivity-type semiconductor region. A second-conductivity-type semiconductor region is selectively formed in the first-conductivity-type well region and separately from the first-conductivity-type semiconductor region, and is formed in a region nearer to the second second-conductivity-type well region than the first-conductivity-type semiconductor region. A second electrode is supplied with the second potential and is connected to the second-conductivity-type semiconductor region.

In addition, according to the above aspect of the invention, there is formed a semiconductor integrated circuit in the aforementioned configuration, further including: a third second-conductivity-type well region which is formed around the second second-conductivity-type well region, and between the first-conductivity-type well region and the second second-conductivity-type well region so as to be adjacent to both of the first-conductivity-type well region and the second second-conductivity-type well region. The third second-conductivity-type region has an impurity concentration lower than the second second-conductivity-type well region.

In addition, according to the above aspect of the invention, there is provided a semiconductor integrated circuit in the aforementioned configuration, wherein: the second electrode is disposed between the third second-conductivity-type region and the first-conductivity-type semiconductor region.

In addition, according to the above aspect of the invention, there is provided a semiconductor integrated circuit in the aforementioned configuration, wherein: at least one of impurity concentration of the first-conductivity-type well region and a distance between a pn junction and the second-conductivity-type semiconductor region is set to prevent a depletion layer which is spread from the pn junction from reaching the second-conductivity-type semiconductor region. The pn junction is formed between the first-conductivity-type well region and the second second-conductivity-type well region.

According to the aforementioned configuration, the second-conductivity-type semiconductor region fixed to the second potential (or potential of an internal power supply or a voltage division point of a voltage division resistor) higher than the first potential is formed between the pn junction area which is located between the first area constituting the high voltage junction terminal region surrounding the high side second circuit and the first-conductivity-type well region, and the first potential (lowest potential) first-conductivity-type semiconductor region which is formed in the first-conductivity-type well region. Accordingly, electrons flowing into the low side first circuit area can be extracted from the second-conductivity-type semiconductor region toward the second electrode by an operation of a parasitic diode (a parasitic pn junction area including the first area and the first-conductivity-type well region) generated when a negative surge voltage occurs (when the fourth potential or the third potential becomes negative). Thus, it is possible to prevent malfunction or breakdown due to latch-up in the logic portion of the low side first circuit connected to the first potential terminal and the second potential terminal (or the internal power supply or the voltage division point of the voltage division resistor).

In addition, according to the aforementioned configuration, the portion of the first-conductivity-type well region right under the second-conductivity-type semiconductor region whose potential is fixed to the second potential higher than the first potential serves as a pinch resistor. Accordingly, anode resistance of a parasitic diode having the first potential first-conductivity-type well region as an anode and the fourth potential second-conductivity-type well region (the second second-conductivity-type well region and the first portion) as a cathode increases when a negative surge voltage occurs. Thus, the injection amount of holes flowing into the high side second circuit connected to the fourth potential terminal and the third potential terminal can be reduced so that malfunction or breakdown due to latch-up in the second circuit can be prevented.

According to the semiconductor integrated circuit according to the invention, it is possible to obtain an effect to prevent malfunction or breakdown of the high side control circuit or the low side control circuit portion.

DETAILED DESCRIPTION OF THE PREFERRED EMBODIMENTS

Preferred embodiments of a semiconductor integrated circuit according to the invention will be described in detail below with reference to the accompanying drawings. In this description and the accompanying drawings, any layer or region prefixed with n or p means that the layer or region contains electrons or holes as majority carriers. In addition, "+" or "−" suffixed to n or p means that any layer or region having "+" or "−" suffixed to n or p has higher impurity concentration or lower impurity concentration than any layer or region having no "+" or "−" suffixed to n or p. Incidentally, in the description of the following exemplary embodiments and the accompanying drawings, the same constituent members are referred to by the same numerals respectively and correspondingly and duplicate description thereof will be omitted.

Embodiment 1

Figure 1:
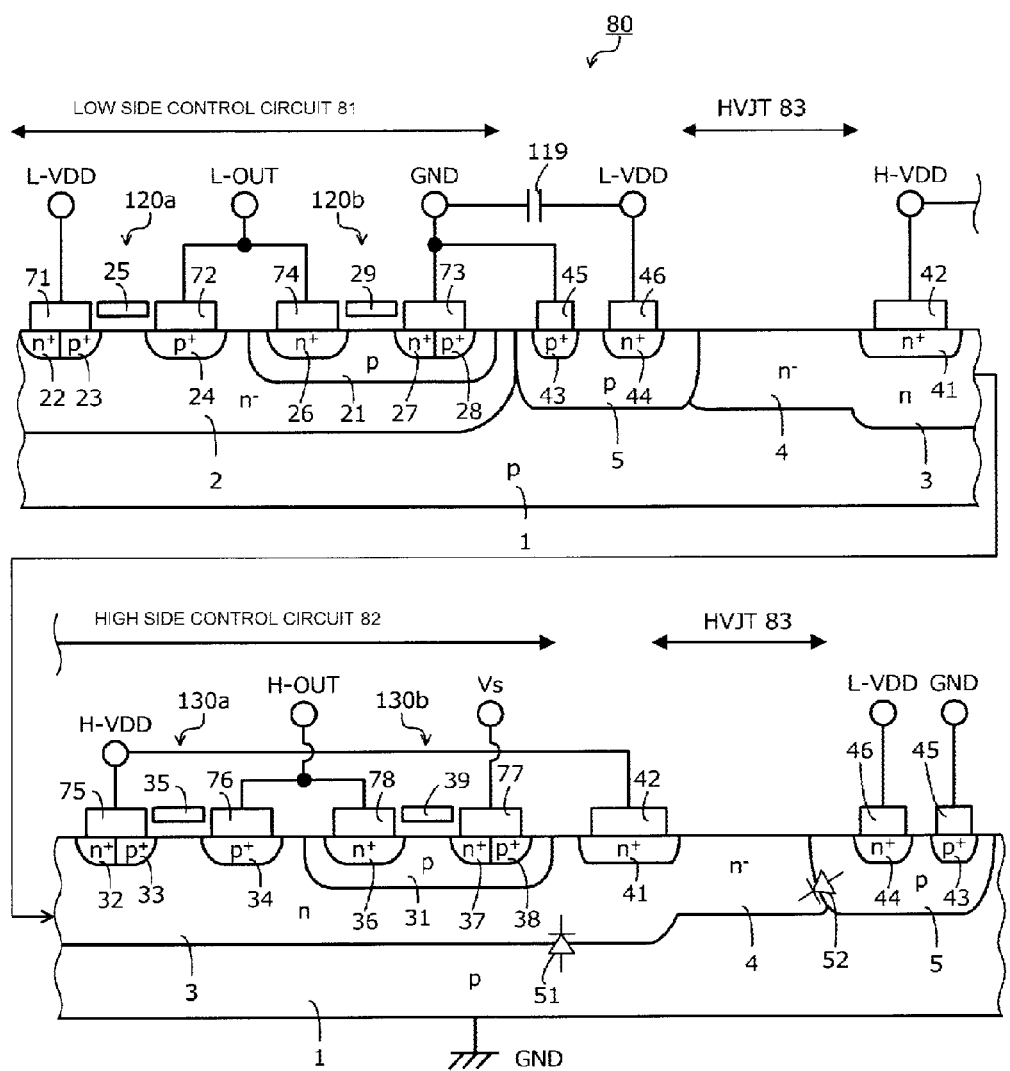
FIG. 1 is a sectional view showing the sectional structure of a high voltage integrated circuit according to Embodiment 1.
Figure 2:
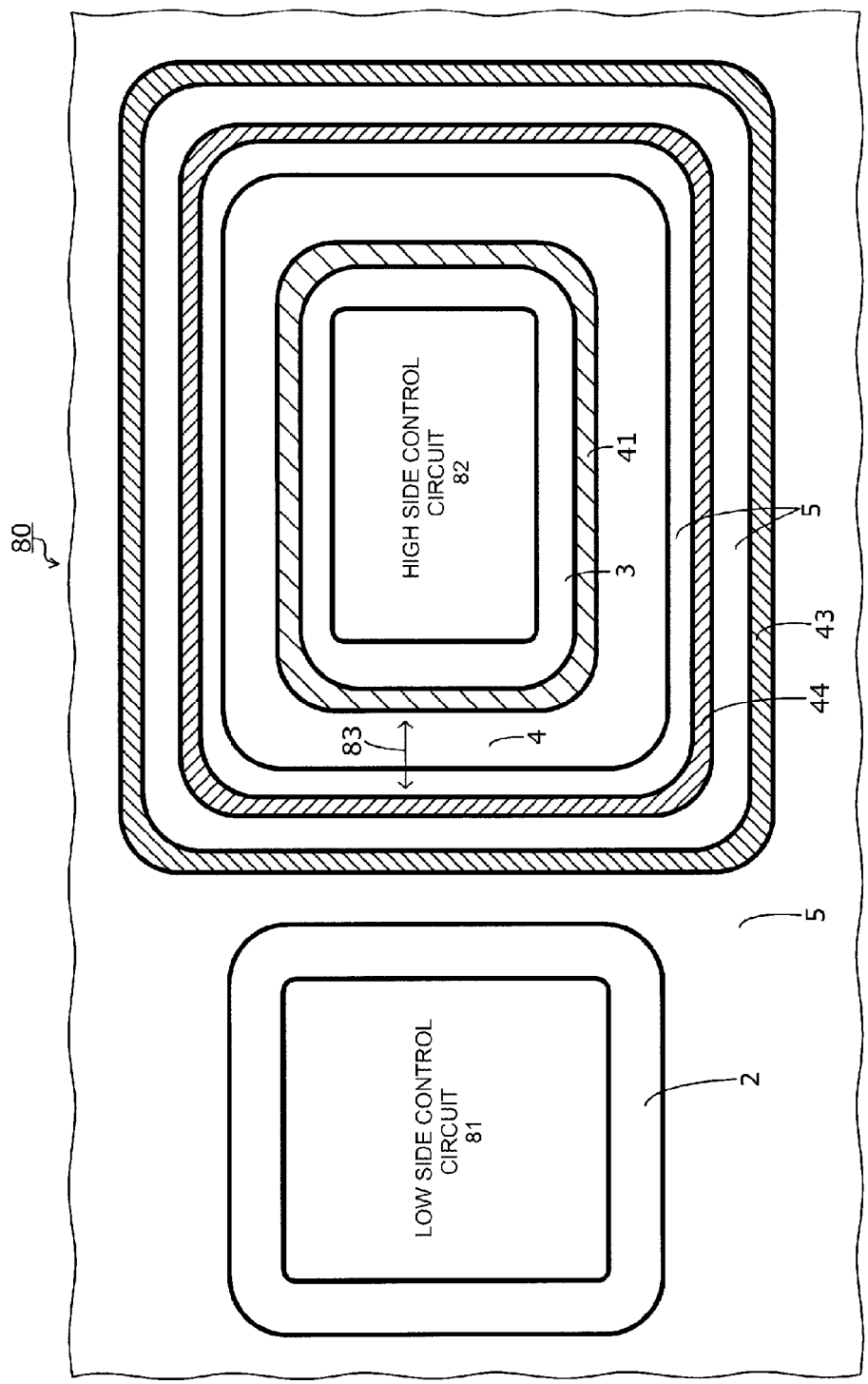
FIG. 2 is a plan view showing the planar structure of the high voltage integrated circuit in FIG. 1.

The structure of a semiconductor integrated circuit according to Embodiment 1 will be described using a self-isolation type high voltage integrated circuit (HVIC) as an example with reference to FIGS. 1, 2 and 7 to 9. FIG. 1 is a sectional view showing the sectional structure of the high voltage integrated circuit according to Embodiment 1. FIG. 2 is a plan view showing the planar structure of the high voltage integrated circuit in FIG. 1. An HVIC 80 according to Embodiment 1 is a drive element corresponding to the HVIC constituting the power conversion device shown in FIG. 7. The HVIC 80 has a function to control ON/OFF of IGBTs 114 and 115 of a half-bridge circuit.

The connection configuration of the HVIC 80 (the circuit configuration of the power conversion device), the circuit configuration of a level shift function (level shift circuit) of the HVIC 80, and a method performed by the HVIC 80 for driving the IGBTs 114 and 115 are the same as those in the related art. Therefore, description thereof will be omitted (see description of FIGS. 7 to 9). Of respective constituent portions of the HVIC 80, FIG. 1 shows a logic portion of a low side control circuit (first circuit portion) 81, a logic portion of a high side control circuit (second circuit portion) 82, and a main part of a high voltage junction terminal region (HVJT) 83, but does not show the level shift circuit.

First, the planar layout of the HVIC 80 will be described. As shown in FIG. 2, n⁻ type well regions (first second-conductivity-type well region) 2 and (third second-conductivity-type well region) 4, an n type well region (second second-conductivity-type well region) 3, and a p type well region (first-conductivity-type well region) 5 are respectively selectively disposed in a p type semiconductor substrate 1. FIG. 2 shows the planar layout of the n⁻ type well regions 2 and 4, the n type well region 3, the p type well region 5, a p⁺ type contact region 43 and an n⁺ type contact region 44 but does not show the remaining configuration.

The low side control circuit 81 is disposed in the n⁻ type well region 2 so that potential (second potential) of an L-VDD higher than the potential of the GND can be supplied (applied) to the low side control circuit 81 from a low voltage power supply (first low voltage power supply) 112 using the potential (ground potential: first potential) of the GND as a reference. The high side control circuit 82 is disposed in the n type well region 3 so that potential (fourth potential) of an H-VDD higher than those of the L-VDD and a Vs can be supplied to the high side control circuit 82 from a low voltage power supply (second low voltage power supply) 113 using the potential (third potential) of the Vs as a reference. The HVJT 83 is constituted by the n⁻ type well region (first portion) 4 and a portion of the p type well region 5 on the n⁻ type well region 4 side.

The n⁻ type well region 4 is adjacent to the n type well region 3 to surround the circumference of the n type well region 3. That is, the circumference of the n type well region 3 is surrounded by the HVJT 83. The n⁻ type well region 2 is disposed outside the n⁻ type well region 4 (on an opposite side to the n type well region 3) and separately from the n⁻ type well region 4. The p type well region 5 is disposed between the n⁻ type well region 2 and the n⁻ type well region 4. The p type well region 5 is adjacent to the n⁻ type well region 2 to surround the circumference of the n type well region 2. In addition, the p type well region 5 is adjacent to the n⁻ type well region 4 to surround the circumference of the n⁻ type well region 4.

The p⁺ type contact region (first-conductivity-type semiconductor region) 43 which is, for example, shaped like a rectangular ring is disposed in the p type well region 5 so as to be separate from the n⁻ type well region 4 and surround the circumference of the n⁻ type well region 4. In addition, the n⁺ type contact region (second-conductivity-type semiconductor region) 44 which is, for example, shaped like a rectangular ring is disposed in the p type well region 5 and between the n⁻ type well region 4 and the p⁺ type contact region 43 so as to be separate from the n⁻ type well region 4 and the p⁺ type contact region 43 and surround the circumference of the n⁻ type well region 4. That is, the circumference of the n⁻ type well region 4 is surrounded by the n⁺ type contact region 44 and the circumference of the n⁺ type contact region 44 is surrounded by the p⁺ type contact region 43.

Next, the sectional structure of the HVIC 80 according to Embodiment 1 will be described. As shown in FIG. 1, the p type semiconductor substrate 1 is connected to the GND. The n⁻ type well regions 2 and 4, the n type well region 3, and the p type well region 5 are respectively selectively formed in a front surface layer of a front surface of the p type semiconductor substrate 1. A first CMOS circuit (a first p-channel MOSFET 120a and a first n-channel MOSFET 120b) can be disposed as a low side control circuit 81 in the n⁻ type well region 2, for example, to output a gate signal to the IGBT 114 of a lower arm of the half-bridge circuit. In addition, although not shown, for example, the low side circuit 216 shown in FIG. 8, the low side circuit 227 shown in FIG. 9, or the like, which serves as a peripheral circuit of a level shift circuit can be disposed as the low side control circuit 81 in the n⁻ type well region 2.

The first p-channel MOSFET 120a has a typical horizontal MOS gate (metal-oxide-semiconductor insulated gate) structure including the n⁻ type well region 2, an n⁺ type contact region 22, a p⁺ type source region 23, a p⁺ type drain region 24, and a gate electrode 25. Specifically, the n⁺ type contact region 22, the p⁺ type source region 23 and the p⁺ type drain region 24 are respectively selectively formed in the front surface layer of the substrate front side of the n⁻ type well region 2. The gate electrode 25 is formed, through a gate insulating film, on the front surface of a portion of the n⁻ type well region 2, which portion is interposed between the p⁺ type source region 23 and the p⁺ type drain region 24. A source electrode 71 makes ohmic contact with the p⁺ type source region 23 and the n⁺ type contact region 22. In addition, the source electrode 71 is connected to the L-VDD. A drain electrode 72 makes ohmic contact with the p⁺ type drain region 24. In addition, the drain electrode 72 is connected to an L-OUT.

The first n-channel MOSFET 120b has a typical horizontal MOS gate structure including a p type offset region 21, an n⁺ type drain region 26, an n⁺ type source region 27, a p⁺ type contact region 28, and a gate electrode 29. Specifically, the p type offset region 21 serving as a base region is selectively formed in the front surface layer of the substrate front side of the n⁻ type well region 2. The n⁺ type drain region 26, the n⁺ type source region 27 and the p⁺ type contact region 28 are respectively selectively formed inside the p type offset region 21. The gate electrode 29 is formed, through a gate insulating film, on the front surface of a portion of the p type offset region 21, which portion is interposed between the n⁺ type drain region 26 and the n⁺ type source region 27. A source electrode 73 makes ohmic contact with the n⁺ type source region 27 and the p⁺ type contact region 28. The source electrode 73 is connected to the GND. A drain electrode 74 makes ohmic contact with the n⁺ type drain region 26. In addition, the drain electrode 74 is connected to the drain electrode 72 of the first p-channel MOSFET 120a and connected to the L-OUT.

The circumference of the n type well region 3 is surrounded by the n⁻ type well region 4 which is formed between the n⁻ type well region 2 and the n type well region 3. The n type well region 3 is electrically separated from the n⁻ type well region 2 by the p type well region 5 which surrounds the circumference of the n⁻ type well region 4 between the n⁻ type well region 4 and the n⁻ type well region 2. The n type well region 3 is a high side floating potential region using intermediate potential (the potential of the Vs) as a reference. The intermediate potential fluctuates in the range of from potential of a high potential side Vss of a high voltage power supply (main circuit power supply) to the potential of the GND. The high side circuit 217 shown in FIG. 8, the high side circuit 226 shown in FIG. 9 or the like is disposed as the high side control circuit 82 in the n type well region 3. FIG. 1 shows a second CMOS circuit (a second p-channel MOSFET 130a and a second n-channel MOSFET 130b) constituting the logic portion of the high side circuit 217.

The second p-channel MOSFET 130a has a typical horizontal MOS gate structure including the n type well region 3, an n⁺ type contact region 32, a p⁺ type source region 33, a p⁺ type drain region 34, and a gate electrode 35. Specifically, the n⁺ type contact region 32, the p⁺ type source region 33 and the p⁺ type drain region 34 are respectively selectively formed in the front surface layer of the substrate front side of the n type well region 3. The gate electrode 35 is formed, through a gate insulating film, on the front surface of a portion of the n type well region 3, which portion is interposed between the p⁺ type source region 33 and the p⁺ type drain region 34. A source electrode 75 makes ohmic contact with the p⁺ type source region 33 and the n⁺ type contact region 32. In addition, the source electrode 75 is connected to the H-VDD. A drain electrode 76 makes ohmic contact with the p⁺ type drain region 34. In addition, the drain electrode 76 is connected to an H-OUT.

The second n-channel MOSFET 130b has a typical horizontal MOS gate structure including a p type offset region 31, an n⁺ type drain region 36, an n⁺ type source region 37, a p⁺ type contact region 38, and a gate electrode 39. Specifically, the p type offset region 31 serving as a base region is selectively formed in the front surface layer of the substrate front side of the n type well region 3. The n⁺ type drain region 36, the n⁺ type source region 37 and the p⁺ type contact region 38 are respectively selectively formed inside the p type offset region 31. The gate electrode 39 is formed, through a gate insulating film, on the front surface of a portion of the n type well region 3, which portion is interposed between the n⁺ type drain region 36 and the n⁺ type source region 37. A source electrode 77 makes ohmic contact with the n⁺ type source region 37 and the p⁺ type contact region 38. The source electrode 77 is connected to the Vs. A drain electrode 78 makes ohmic contact with the n⁺ type drain region 36. In addition, the drain electrode 78 is connected to the drain electrode 76 of the second p-channel MOSFET 130a and connected to the H-OUT.

In addition, an n⁺ type contact region 41 is selectively formed in the front surface layer of the substrate front side of the n type well region 3. The n⁺ type contact region 41 is a fixed potential region which fixes the potential of the n type well region 3 to the potential of the H-VDD using the potential of the Vs as a reference. For example, the n⁺ type contact region 41 has a planar shape of a rectangular ring which surrounds the high side control circuit 82. A first pickup electrode 42 makes ohmic contact with the n⁺ type contact region 41. In addition, the first pickup electrode 42 is connected to the H-VDD and electrically connected to the source electrode 75 of the second p-channel MOSFET 130a. The first pickup electrode 42 is disposed more closely to the high side control circuit 82 than the HVJT 83.

When a reverse bias voltage is applied between the first pickup electrode 42 and a second pickup electrode (first electrode) 45 which will be described later, a region depleted by a depletion layer which is spread from a pn junction between the p type well region 5 and the n⁻ type well region 4 to the p type well region 5 and the n⁻ type well region 4 serves as the HVJT (High Voltage Junction Terminal region) 83. The impurity concentration of the p type well region 5 and/or the arrangement of an n⁺ type contact region 44 (for example, the distance between the pn junction between the p type well region 5 and the n⁻ type well region 4 and the n⁺ type contact region 44) are adjusted so that the depletion layer which is spread from the pn junction between the p type well region 5 and the n⁻ type well region 4 cannot reach the n⁺ type contact region 44 inside the p type well region 5 when a reverse bias voltage is applied between the first pickup electrode 42 and the second pickup electrode 45. That is, the HVJT 83 is constituted by the n⁻ type well region 4 and a portion (second portion) of the p type well region 5 which is closer to the n⁻ type well region 4 than the n⁺ type contact region 44. Incidentally, the value of the reverse bias voltage described herein is the rated voltage of the HVIC 80. The rated voltage is, for example, about 600V in the case of 100V to 250V AC and about 1,200V in the case of 400V AC.

The p type well region 5 is formed to be adjacent to the residual portion of the p type semiconductor substrate 1 (of the p type semiconductor substrate 1, a back side portion where the n⁻ type well regions 2 and 4 and the n type well region 3 are not formed). The p type well region 5 is a fixed potential region which is electrically connected to the GND through the p⁺ type contact region 43 and the second pickup electrode 45 as will be described later so as to fix the potential of the p type semiconductor substrate 1 to the potential of the GND. That is, the p type well region 5 serves as a self-isolation region which electrically separates the n⁻ type well region 2 connected to the GND and the L-VDD (or an intermediate potential line generated by the low side control circuit 81), from the n type well region 3 and the n⁻ type well region 4 connected to the H-VDD and the Vs. The impurity concentration of the p type well region 5 is higher than the impurity concentration of the p type semiconductor substrate 1.

The intermediate potential generated by the low side control circuit 81 means floating potential fluctuating in the range of from the potential of the L-VDD to the potential of the GND. For example, the intermediate potential corresponds to the potential at an internal power supply or a voltage division point of a voltage division resistor (hereinafter simply referred to as internal power supply). Thus, the p type well region 5 may be formed in, of an n type well region (for example, one n⁻ type well region provided continuously in place of the n⁻ type well regions 2 and 4) surrounding the circumference of the n type well region 3, an area closer to the n type well region 3 than a region where the low side control circuit 81 is provided, so that the p type well region 5 can penetrate the n⁻ type well region to extend in a depth direction from the substrate front surface separately from the n type well region 3 and adjacently to the residual portion of the p type semiconductor substrate 1.

The p⁺ type contact region 43 is selectively formed in the front surface layer of the substrate front side of the p type well region 5. In addition, the n⁺ type contact region 44 is selectively formed in the front surface layer of the substrate front side of the p type well region 5 and between the p⁺ type contact region 43 and the n⁻ type well region 4 so as to be separate from the p⁺ type contact region 43 and the n⁻ type well region 4. The impurity concentration of the p type well region 5 is lower than the impurity concentration of the p⁺ type contact region 43. The p⁺ type contact region 43 is not disposed between the HVJT 83 and the n⁺ type contact region 44. That is, the p⁺ type contact region 43 is disposed more closely to the low side control circuit 81 than the n⁺ type contact region 44.

The second pickup electrode 45 makes ohmic contact with the p⁺ type contact region 43. In addition, the second pickup electrode 45 is connected to the GND and electrically connected to the source electrode 73 of the first n-channel MOSFET 120b. The second pickup electrode 45 is disposed more closely to the low side control circuit 81 than the HVJT 83. In addition, the second pickup electrode 45 is not disposed between the HVJT 83 and the n⁺ type contact region 44. That is, the second pickup electrode 45 is disposed more closely to the low side control circuit 81 than a third pickup electrode (second electrode) 46 which will be described later. The third pickup electrode 46 makes ohmic contact with the n⁺ type contact region 44. In addition, the third pickup electrode 46 is connected to the L-VDD or the internal power supply.

The impurity concentration of the p type well region 5 or the interval between the p⁺ type contact region 43 and the n⁺ type contact region 44 is adjusted so as to prevent a parasitic diode consisting of the p⁺ type contact region 43 (anode) and the n⁺ type contact region 44 (cathode) from breaking down due to avalanche when a voltage corresponding to the potential of the L-VDD is applied between the second pickup electrode 45 and the third pickup electrode 46. Although not shown, an n-channel MOSFET 211 constituting a level-up circuit 210 is disposed in the n⁻ type well region 4 and the p type well region 5. In addition, if necessary, a level-down circuit 220 which reduces the level of an alarm signal based on an abnormality signal 110 indicating abnormality such as overheating or overcurrent in the IGBT 115 may be disposed in the n type well region 3, the n⁻ type well region 4 and the p type well region 5 in the same manner as the level-up circuit 210.

A capacitor 119 with a capacity of several hundred nF externally attached to the outside of the HVIC 80 is provided between the terminals of the L-VDD and the GND. The H-OUT, the L-OUT, the H-VDD, the L-VDD, the Vs and the GND are terminals corresponding to the H-OUT, the L-OUT, the H-VDD, the L-VDD, the Vs and the GND in FIG. 7 respectively. The H-OUT is an output terminal which is connected to a gate of the IGBT 115 of an upper arm of the half-bridge circuit so as to supply a gate signal to the IGBT 115. The L-OUT is an output terminal which is connected to the gate of the IGBT 114 of the lower arm of the half-bridge circuit so as to supply a gate signal to the IGBT 114. The H-VDD is a terminal which connects the high potential side of the low voltage power supply 113 using potential of a Vs terminal 111 as a reference. The L-VDD is a terminal which connects the high potential side of the low voltage power supply 112 using the potential of the GND as a reference. The L-VDD is lower in potential than the H-VDD. The Vs is a terminal of intermediate potential fluctuating in the range of from the potential of the high potential side Vss of the high voltage power supply (main circuit power supply) to the potential of the GND. The Vs is as high in potential as an output terminal (Vs terminal 111) of the half-bridge circuit including the IGBTs 114 and 115.

Next, a method for manufacturing the HVIC 80 according to Embodiment 1 will be described. First, photolithography and ion implantation are performed repeatedly several times so that impurities for forming the n⁻ type well regions 2 and 4, the n type well region 3, and the p type well region 5 can be respectively selectively introduced into the front surface layer of the front surface of the p type semiconductor substrate 1. Next, heat treatment is performed, for example, at a high temperature (not lower than about 1,100° C. and not higher than about 1,200° C.) to diffuse the introduced impurities to predetermined depths so as to form the n⁻ type well regions 2 and 4, the n type well region 3, and the p type well region 5. The n⁻ type well regions 2 and 4 and the n type well region 3 are formed, for example, by ion implantation of phosphorus (P). The n⁻ type well regions 2 and 4 may be formed simultaneously, for example, by ion implantation performed one time. The p type well region 5 is formed, for example, by ion implantation of boron (B). The sequence for forming the n⁻ type well regions 2 and 4, the n type well region 3, and the p type well region 5 may be changed variously.

Next, impurities for forming the p type offset regions 21 and 31 are respectively selectively introduced into the front surface layers of the n⁻ type well region 2 and the n type well region 3 by photolithography and, for example, ion implantation of boron. Next, heat treatment is performed, for example, at a high temperature (about 1,100° C. to about 1,200° C.) to diffuse the introduced impurities to predetermined depths so as to form the p type offset regions 21 and 31. The p type offset regions 21 and 31 may be formed simultaneously by ion implantation performed one time or may be formed separately by different ion implantations. Next, impurities for forming the n⁺ type contact region 41 are selectively introduced into the front surface layer of the n type well region 3 by photolithography and, for example, ion implantation of arsenic (As). Next, the introduced impurities are diffused to a predetermined depth by heat treatment at a temperature, for example, not lower than about 750° C. and not higher than about 900° C., to thereby form the n⁺ type contact region 41. The surface impurity concentration of the n⁺ type contact region 41 may be set, for example, at about $1 \times 10^{20}/cm^3$.

Next, impurities for forming the n⁺ type contact region 44 are selectively introduced into the front surface layer of the p type well region 5 by photolithography and ion implantation. Next, the n⁺ type contact region 44 is diffused to a predetermined depth by heat treatment. The n⁺ type contact region 44 may be formed simultaneously with the n⁺ type contact region 41, for example, by the ion implantation for forming the n⁺ type contact region 41. Next, impurities for forming the p⁺ type contact region 43 are selectively introduced into the front surface layer of the p type well region 5 by photolithography and ion implantation. Next, the introduced impurities are diffused to a predetermined depth by heat treatment to form the p⁺ type contact region 43.

Next, impurities for forming predetermined n⁺ type regions are respectively selectively introduced into the front surface layers of the n⁻ type well region 2, the n type well region 3 and the p type offset regions 21 and 31 by photolithography and, for example, ion implantation of arsenic (As). When the respective n⁺ type regions formed by the ion implantation performed one time are the n⁺ type contact region 22, the n⁺ type drain region 26 and the n⁺ type source region 27 of the low side control circuit 81, and the n⁺ type contact region 32, the n⁺ type drain region 36 and the n⁺ type source region 37 of the high side control circuit 82. Next, the introduced impurities are diffused to predetermined depths, for example, by heat treatment at a temperature, for example, not lower than about 750° C. and not higher than about 900° C. to thereby form these n⁺ type regions. The surface impurity concentration of each of these n⁺ type regions may be set, for example, at about $1 \times 10^{20}/cm^3$.

Next, impurities for forming predetermined p⁺ type regions are respectively selectively introduced into the front surface layers of the n⁻ type well region 2, the n type well region 3 and the p type offset regions 21 and 31 by photolithography and, for example, ion implantation of boron fluoride (BF₂). When the respective p⁺ type regions formed by the ion implantation performed one time are the p⁺ type source region 23, the p⁺ type drain region 24 and the p⁺ type contact region 28 of the low side control circuit 81, and the p⁺ type source region 33, the p⁺ type drain region 34 and the p⁺ type contact region 38 of the high side control circuit 82. Next, the introduced impurities are diffused to predetermined depths by heat treatment to thereby form these p⁺ type regions. The surface impurity concentration of each of these p⁺ type regions may be set at about $1 \times 10^{20}/cm^3$.

When the respective n⁺ type regions and the respective p⁺ type regions of the low side control circuit 81 are formed, the respective semiconductor regions constituting the first p-channel MOSFET 120a and the first n-channel MOSFET 120b are formed. When the respective n⁺ type regions and the respective p⁺ type regions of the high side control circuit 82 are formed, the respective semiconductor regions constituting the second p-channel MOSFET 130a and the second n-channel MOSFET 130b are formed. The sequence for forming the n⁺ type contact region 41, the p⁺ type contact region 43, the n⁺ type contact region 44, the other n⁺ type regions and the other p⁺ type regions can be changed variously. In addition, heat treatment for forming the respective n⁺ type regions and heat treatment for forming the respective p⁺ type regions may be performed simultaneously.

Next, the gate insulating films and the gate electrodes 25, 29, 35, and 39 of the MOSFETs (the reference numerals 120a, 120b, 130a and 130b) formed in the low side control circuit 81 and the high side control circuit 82 are formed. Next, an interlayer insulating film (not shown) is formed on the front surface of the p type semiconductor substrate 1, and a plurality of contact holes are formed. Next, a metal layer serving as front surface electrodes is deposited on the substrate front surface and patterned to form the source electrodes 71, 73, 75 and 77, the drain electrodes 72, 74, 76, and 78 and the first to third pickup electrodes 42, 45 and 46. Then, a passivation protection film etc. is formed to cover the substrate front surface. Thus, the HVIC 80 shown in FIG. 1 is completed.

Figure 3:
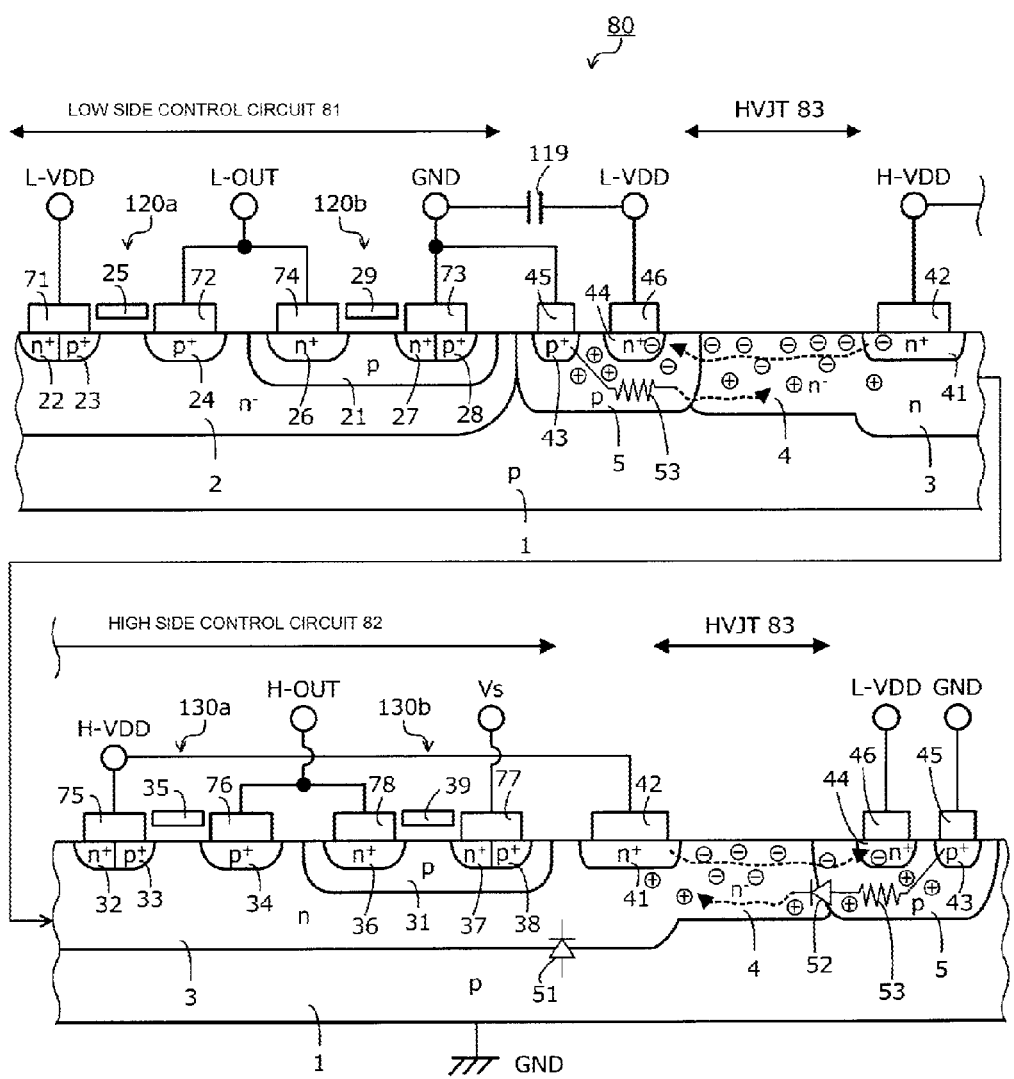
FIG. 3 is an explanatory view showing behavior of electrons and holes when a negative surge voltage is applied to the high voltage integrated circuit in FIG. 1 via an H-VDD.

Next, a state when a negative surge voltage occurs (when the potential of the H-VDD or the potential of the Vs becomes negative) in the HVIC 80 via the H-VDD will be described. FIG. 3 is an explanatory view showing behavior of electrons and holes when a negative surge voltage is applied to the high voltage integrated circuit in FIG. 1 via the H-VDD. In the HVIC 80 according to the exemplary embodiment 1, a pn junction between the n⁺ type contact region 44 connected to the L-VDD and the p type well region 5 is brought into a reverse bias state, and a portion of the p type well region 5 right under the n⁺ type contact region 44 (on the substrate back side) serves as a pinch resistor 53. Therefore, when the negative surge voltage is applied to the H-VDD via the Vs terminal 111, anode resistance of a parasitic pn diode 52 consisting of the p type well region 5 (anode) and the n⁻ type well region 4 (cathode) is increased by the pinch resistor 53. Thus, the injection amount of minority carriers (holes) injected from the p type well region 5 into the n type well region 3 via the n⁻ type well region 4 is reduced sharply. Thus, the injection amount of holes entering the second p-channel MOSFET 130a or the second n-channel MOSFET 130b constituting the logic portion of the high side control circuit 82 can be suppressed. In addition, since the third pickup electrode 46 connected to the L-VDD is disposed more closely to the high side control circuit 82 than the second pickup electrode 45 connected to the GND, the minority carriers (electrons) injected from the n⁻ type well region 4 into the p type well region 5 are extracted rapidly from the third pickup electrode 46 by a forward current of the parasitic pn diode 52. Thus, the amount of electrons entering the n⁻ type well region 2 from the p type well region 5 can be also suppressed. Thus, the injection amount of electrons entering the first p-channel MOSFET 120*a* or the first n-channel MOSFET 120*b* constituting the logic portion of the low side control circuit 81 can be suppressed. Accordingly, it is possible to simultaneously prevent malfunction or breakdown due to latch-up in the logic portions of the high side control circuit 82 and the low side control circuit 81.

In addition, electrons are extracted transiently to the $n^+$ type contact region 44 and the third pickup electrode 46 when the negative surge voltage occurs. Accordingly, there is a fear that the voltage of the L-VDD to which the $n^+$ type contact region 44 and the third pickup electrode 46 are connected may decrease. When the capacitor 119 having a capacity of about several hundred nF is connected between the terminals of the L-VDD and the GND as described above, the transient voltage decrease of the L-VDD can be suppressed to be small enough not to cause any problem in operation of the HVIC 80. The reference numeral 51 designates a parasitic pn diode including the p type semiconductor substrate 1 and the n type well region 3.

As described above, according to Embodiment 1, the $n^+$ type contact region fixed to higher potential (as the potential of the L-VDD or the potential of the internal power supply) than the potential of the GND is provided between the pn junction area which is located between the $n^-$ type well region and the p type well region constituting the HVJT surrounding the high side control circuit portion, and the $p^+$ type contact region of the GND potential which is provided in the p type well region. Accordingly, electrons flowing into the low side control circuit can be extracted toward the third pickup electrode from the $n^+$ type contact region by operation of the parasitic pn diode generated when the negative surge voltage occurs (the potential of the H-VDD or the potential of the Vs becomes negative). Thus, it is possible to prevent malfunction or breakdown due to latch-up in the logic portion of the low side control circuit connected to the GND and the L-VDD (or the internal power supply).

In addition, according to Embodiment 1, of the p type well region, an area right under the $n^+$ type contact region fixed to higher potential than the GND potential serves as the pinch resistor. Accordingly, the anode resistance of the parasitic diode in which the p type well region of the GND potential serves as an anode and the n type well region (the n type well region and the $n^-$ type well region) of the H-VDD potential serves as a cathode is increased when the negative surge voltage occurs. Thus, the injection amount of holes flowing into the high side control circuit connected to the H-VDD and the Vs can be reduced. It is therefore possible to prevent malfunction or breakdown due to latch-up in the high side control circuit portion.

Embodiment 2

Figure 4:
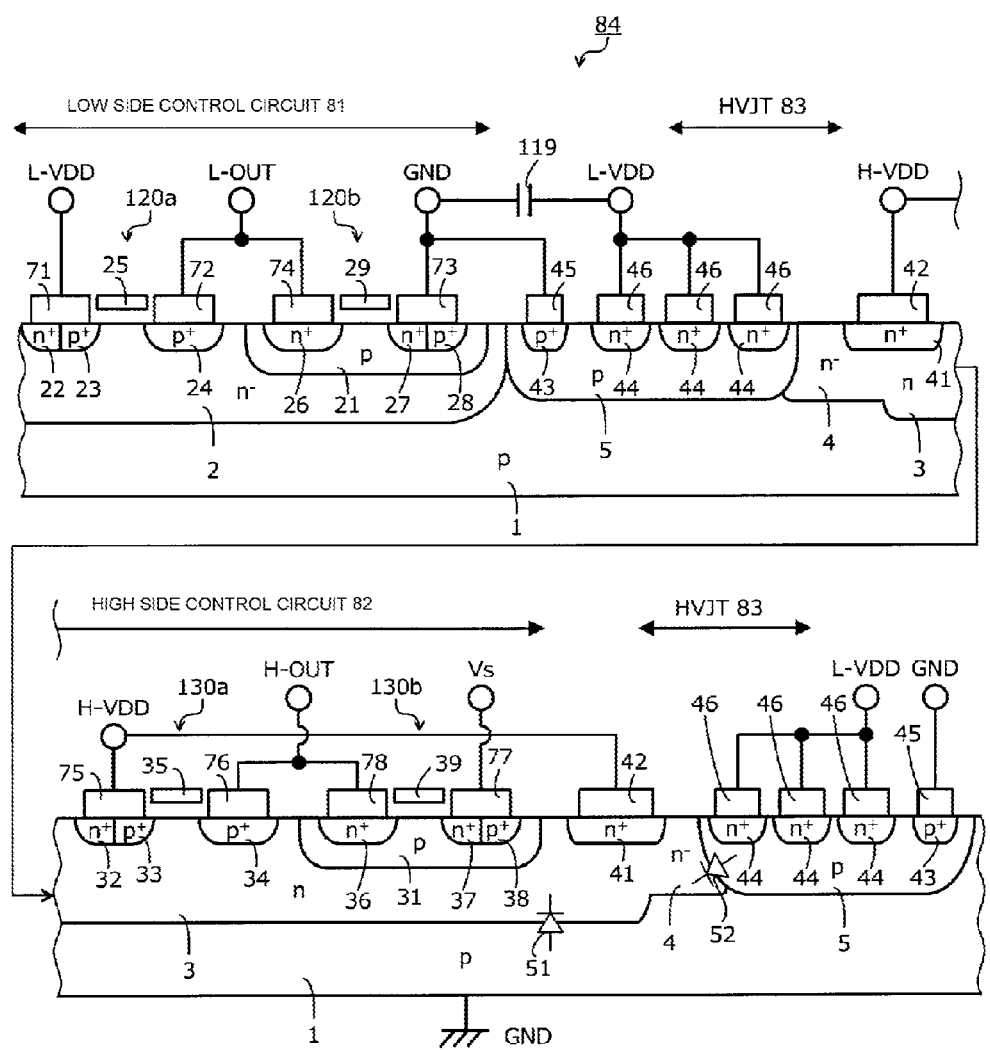
FIG. 4 is a sectional view showing the structure of a main part of a high voltage integrated circuit according to Embodiment 2.

Next, the structure of a semiconductor integrated circuit (HVIC) according to Embodiment 2 will be described. FIG. 4 is a sectional view showing the structure of a main part of the high voltage integrated circuit according to Embodiment 2. An HVIC 84 according to Embodiment 2 is different from the HVIC according to Embodiment 1 in the point that a plurality of $n^+$ type contact regions 44 connected to higher potential than the potential of the GND are disposed in the p type well region 5 in parallel with one another in a direction from the $n^-$ type well region 4 toward the outside (p type well region 5 side). That is, two or more $n^+$ type contact regions 44 each having a planar shape of a rectangular ring are formed in the p type well region 5 to surround the circumference of the $n^-$ type well region 4 (HVJT 83) doubly or more. FIG. 4 shows the case where, for example, three $n^+$ type contact regions 44 are disposed.

Specifically, the $n^+$ type contact regions 44 are disposed separately from one another in the front surface layer of the substrate front side of the p type well region 5. The innermost (on the side of the high side control circuit 82) one of the plurality of $n^+$ type contact regions 44 is disposed separately from the $n^-$ type well region 4 to surround the circumference of the $n^-$ type well region 4. Of the plurality of $n^+$ type contact regions 44, anyone except the innermost $n^+$ type contact region 44 surrounds the circumference of its inner $n^+$ type contact region 44. Third pickup electrodes 46 make ohmic contact with the $n^+$ type contact regions 44 respectively. All the third pickup electrodes 46 are connected to intermediate potential lines generated by the L-VDD or the low side control circuit 81.

In this manner, the structure is formed so that the plurality of $n^+$ type contact regions 44 connected to higher potential than the potential of the GND are disposed in the p type well region 5. Accordingly, a pinch resistor (that is, anode resistance of a parasitic pn diode 52) in a portion of the p type well region 5 right under the $n^+$ type contact regions 44 can be further increased. Therefore, an injection amount of carriers injected into the high side control circuit 82 or the low side control circuit 81 can be further reduced.

As described above, Embodiment 2 can obtain the same effects as those in Embodiment 1.

Embodiment 3

Figure 5:
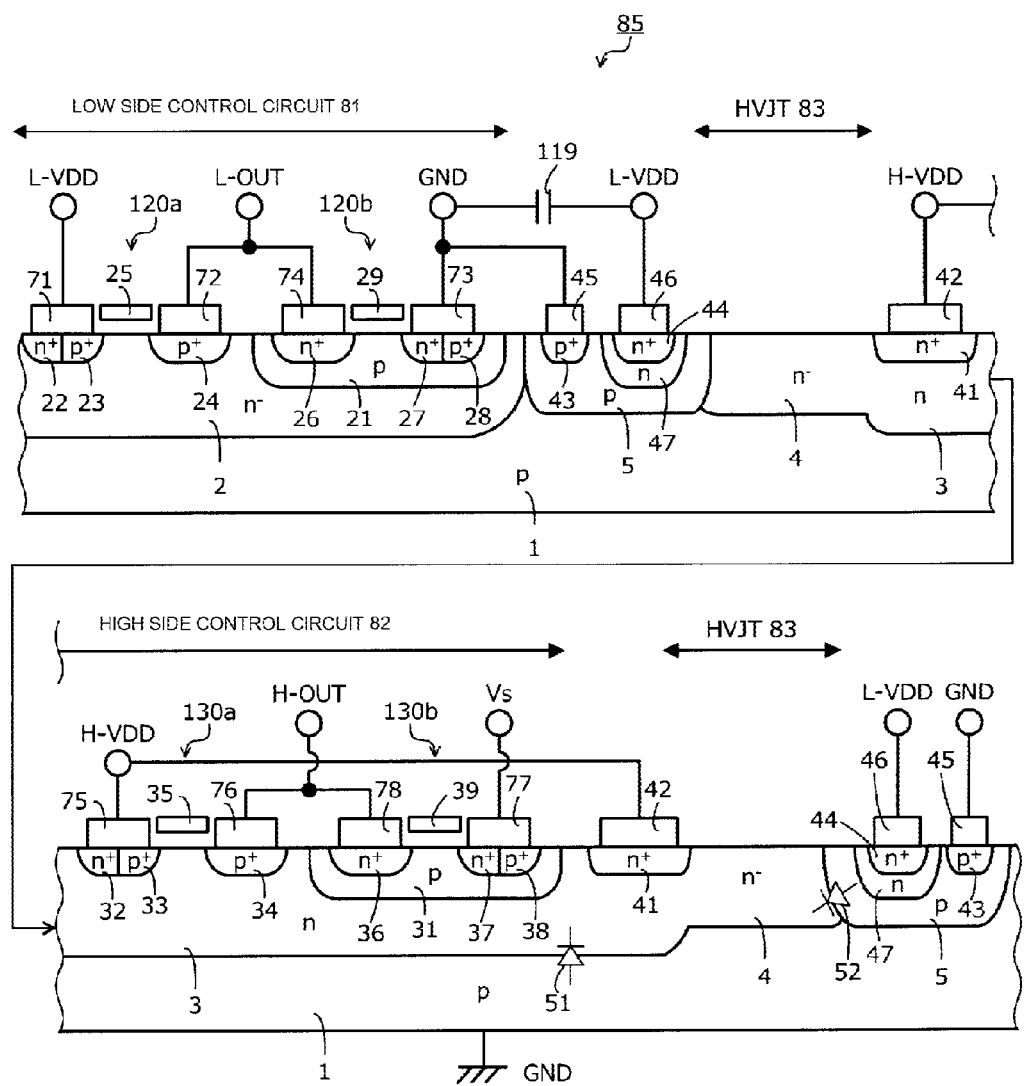
FIG. 5 is a sectional view showing the structure of a main part of a high voltage integrated circuit according to Embodiment 3.

Next, the structure of a semiconductor integrated circuit (HVIC) according to Embodiment 3 will be described. FIG. 5 is a sectional view showing the structure of a main part of the high voltage integrated circuit according to Embodiment 3. An HVIC 85 according to Embodiment 3 is different from the HVIC according to Embodiment 1 in the point that an n type buffer region 47 having a shallower diffusion depth than the p type well region 5 is formed to cover the lower side (substrate back side) of an $n^+$ type contact region 44 connected to higher potential than the potential of the GND. Specifically, the n type buffer region 47 is selectively formed in a front surface layer of a substrate back side of the p type well region 5, and the $n^+$ type contact region 44 is selectively formed inside the n type buffer region 47.

In the HVIC 85 according to Embodiment 3, a portion of the p type well region 5 right under the n type buffer region 47 becomes a pinch resistor. The diffusion depth of the n type buffer region 47 is larger than the diffusion depth of the $n^+$ type contact region 44. Accordingly, a deep portion of the p type well region 5 becomes the pinch resistor in comparison with the case where no n type buffer region 47 is formed. Accordingly, anode resistance of a parasitic pn diode 52 can be further increased and an injection amount of carriers injected into the high side control circuit 82 or the low side control circuit 81 can be further reduced.

In addition, in Embodiment 3, the n type buffer region 47 may be formed inside the p type well region 5. Accordingly, the HVIC 85 substantially has the same chip size as the HVIC having the configuration in which no n type buffer region 47 is formed. In addition, the n type buffer region 47 can be formed simultaneously with, for example, an n type offset drain region (not shown) of the second n-channel MOSFET 130*b*, which is, for example, a 20V breakdown voltage class MOSFET, constituting the logic portion of the high side control circuit 82. The n type offset drain region is a region which is formed in the front surface layer of the substrate front side of the p type offset region 31 to cover the lower side of the n⁺ type drain region 36 in order to secure a predetermined breakdown voltage. The n type buffer region 47 is formed simultaneously with the n type offset drain region so that the n type buffer region 47 can be formed without adding a new step.

As described above, Embodiment 3 can obtain the same effects as those in Embodiment 1 or 2.

Embodiment 4

Figure 6:
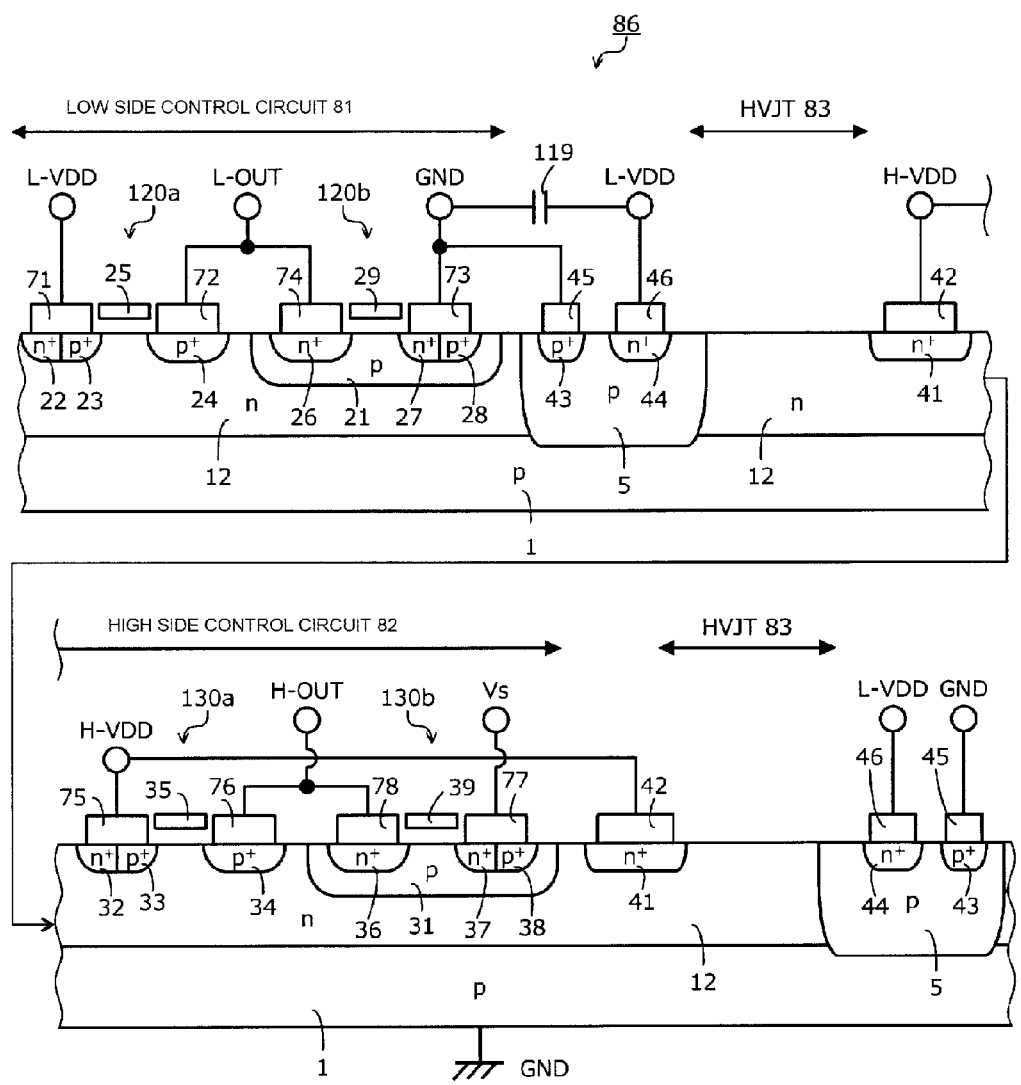
FIG. 6 is a sectional view showing the structure of a main part of a high voltage integrated circuit according to Embodiment 4.
Figure 7:
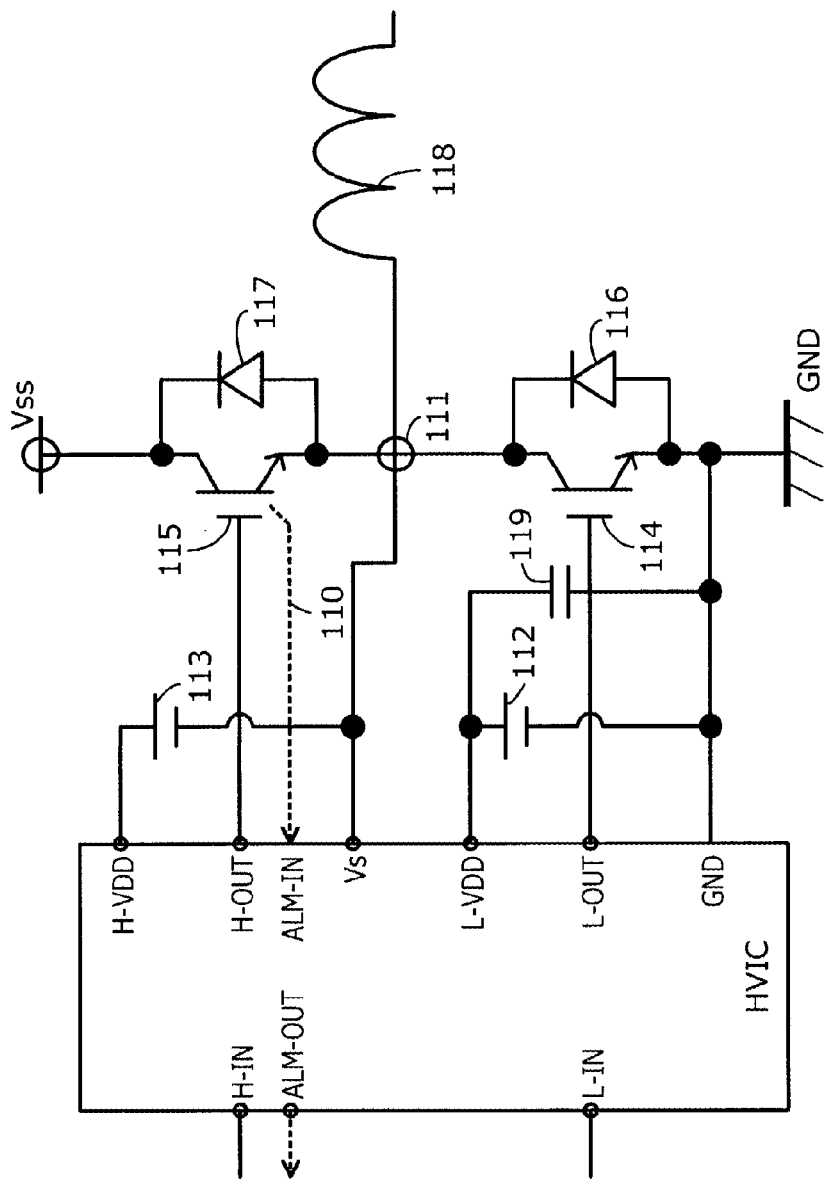
FIG. 7 is a circuit diagram showing the connection configuration of a high voltage integrated circuit.
Figure 8:
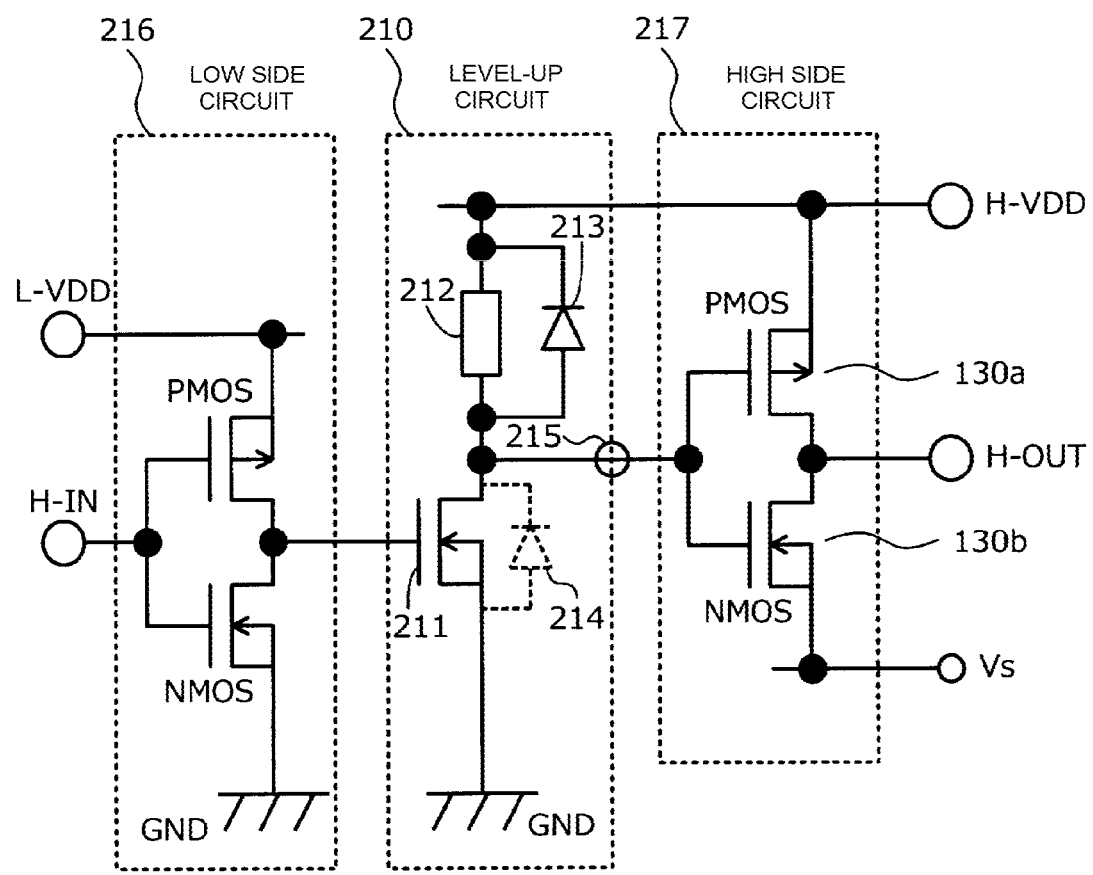
FIG. 8 is a circuit diagram showing the configuration of a level-up circuit.
Figure 9:
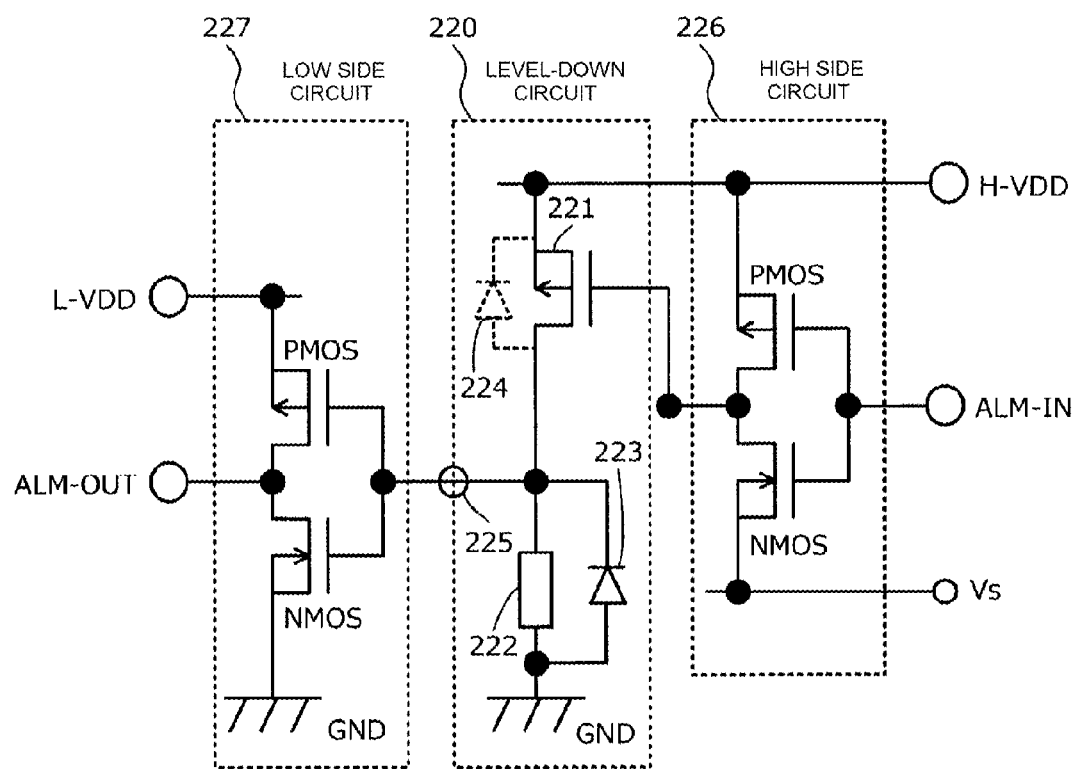
FIG. 9 is a circuit diagram showing the configuration of a level-down circuit.
Figure 10:
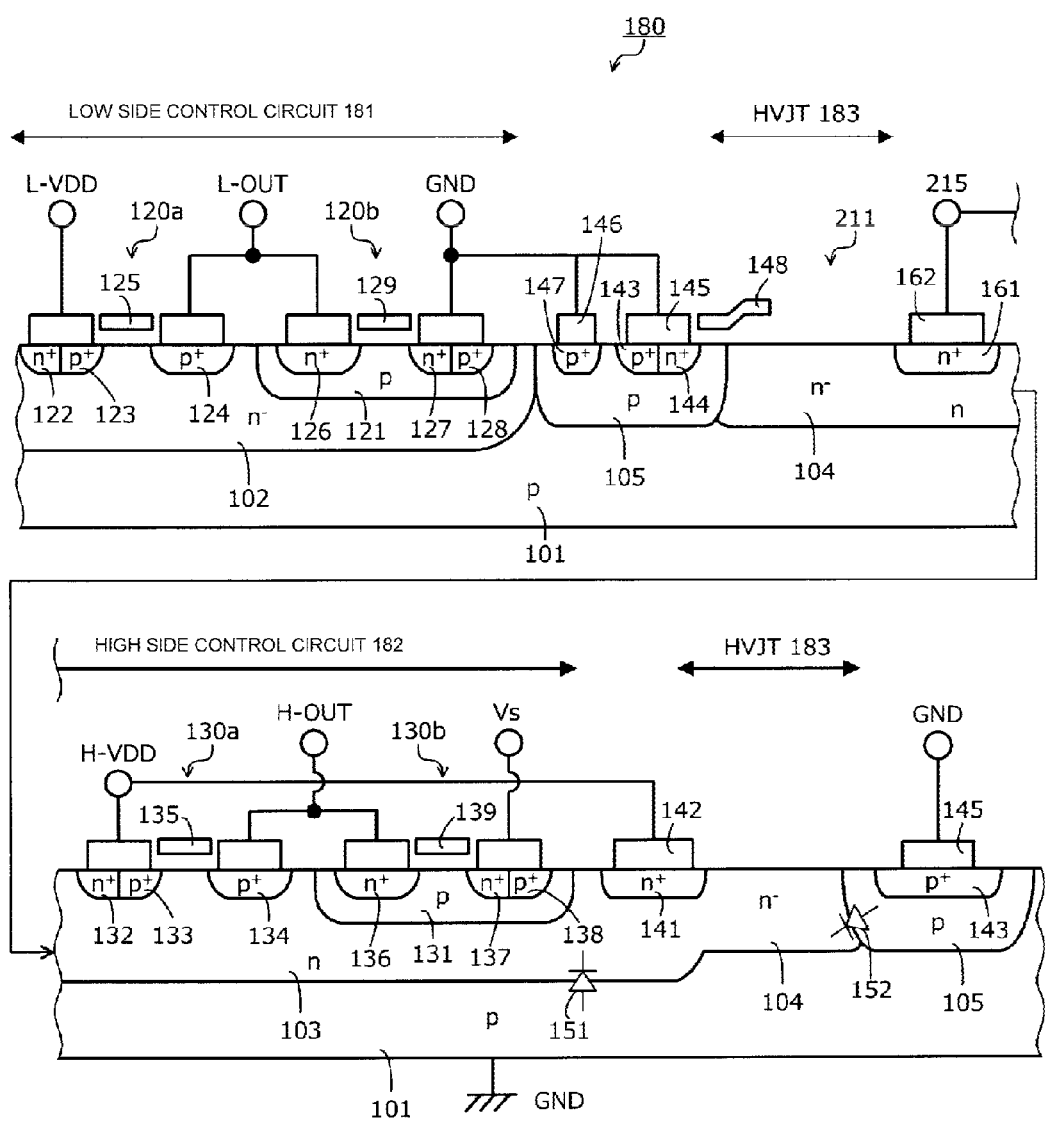
FIG. 10 is a sectional view showing the structure of a high voltage integrated circuit according to the related art.
Figure 11:
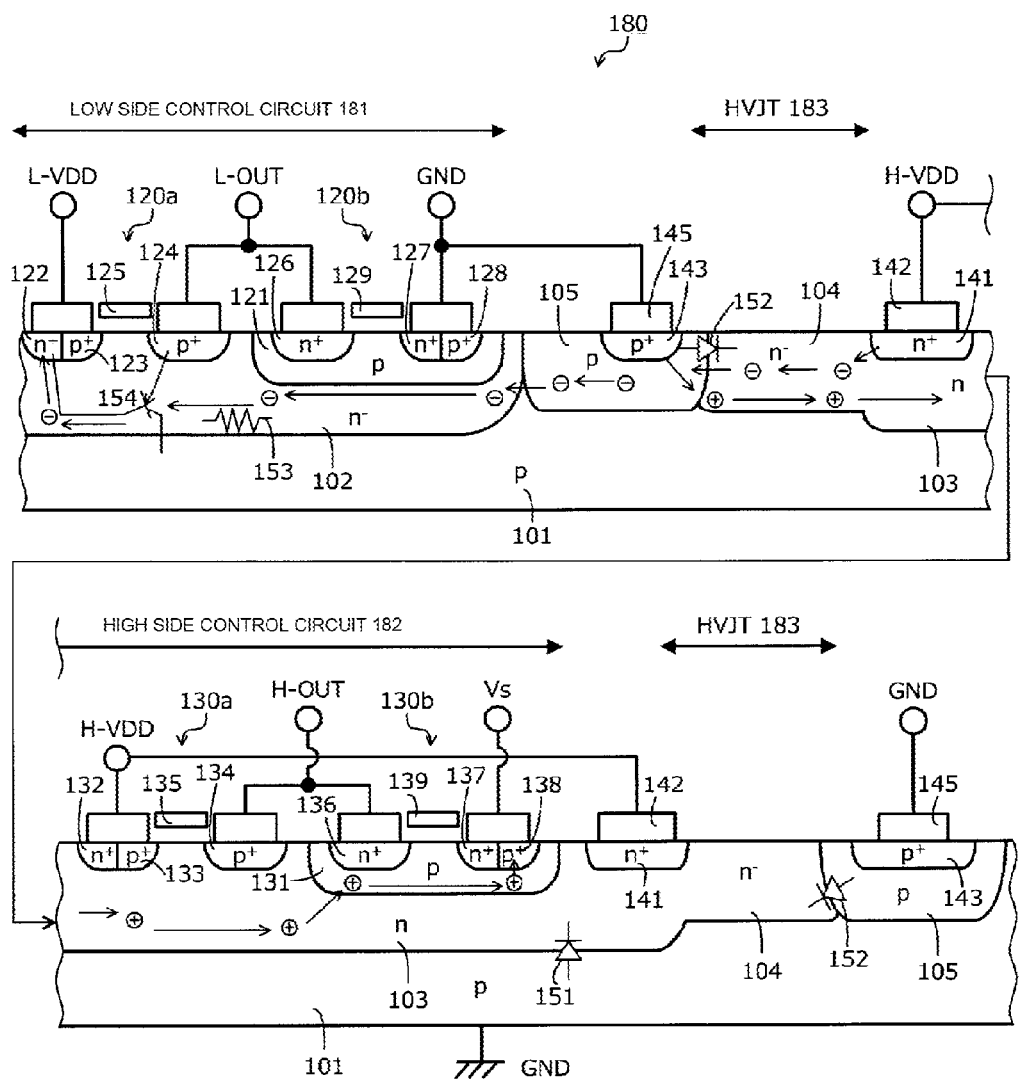
FIG. 11 is an explanatory view showing behavior of electrons and holes when a negative surge voltage is applied to the high voltage integrated circuit in FIG. 10 via an H-VDD.

Next, the structure of a semiconductor integrated circuit (HVIC) according to Embodiment 4 will be described. FIG. 6 is a sectional view showing the structure of a main part of the high voltage integrated circuit according to Embodiment 4. An HVIC 86 according to Embodiment 4 is different from the HVIC according to Embodiment 1 in the point that an n type epitaxial growth layer 12 is formed in place of the n type regions (the n⁻ type well regions 2 and 4 and the n type well region 3 in FIG. 1) constituting the high side control circuit 82, the low side control circuit 81 and the HVJT 83. That is, the HVIC 86 is produced by use of an epitaxial substrate (semiconductor chip) formed by laminating the n type epitaxial growth layer 12 on a front surface of a p type semiconductor substrate (p type support substrate) 1.

The first and second p-channel MOSFETs 120a and 130a and the first and second n-channel MOSFETs 120b and 130b are provided in the n type epitaxial growth layer 12 in the same manner as in the exemplary embodiment 1. A p type well region 5 is formed to penetrate the n type epitaxial growth layer 12 to extend from the front surface of the epitaxial substrate (the surface of the n type epitaxial growth layer 12 side) and have a depth reaching the p type semiconductor substrate 1. The point that a p⁺ type contact region 43 and an n⁺ type contact region 44 are respectively selectively formed in the front surface layer of the epitaxial substrate front side of the p type well region 5 is the same as that in Embodiment 1.

In addition, Embodiment 4 may be applied to the aforementioned Embodiment 2 or 3 to produce an HVIC using an epitaxial substrate.

As described above, Embodiment 4 can obtain the same effects as those in Embodiments 1 to 3.

In the above description, the invention is not limited to the aforementioned embodiments but may be applied to various integrated circuits in each of which a parasitic pn junction area (parasitic pn diode) is formed between a high side control circuit and an HVJT. In addition, the embodiments can be also established when the conductivity type (n type or p type) of each semiconductor layer or each semiconductor region is inverted.

As described above, the semiconductor integrated circuit according to the invention is useful as a high voltage integrated circuit which can be used, for example, in the case where an ON/OFF drive signal is transmitted to a gate of a power device in a PWM inverter, a switching power supply, etc.

What is claimed is:
1. A semiconductor integrated circuit comprising:
a first-conductivity-type semiconductor substrate;
a first second-conductivity-type well region formed in one main surface side of the first-conductivity-type semiconductor substrate;
a second second-conductivity-type well region formed in the one main surface side of the substrate and separately from the first second-conductivity-type well region;
a first circuit formed in the first second-conductivity-type well region and supplied with a second potential higher than a first potential, the second potential being supplied from a first low voltage power supply using the first potential as a reference;
a second circuit formed in the second second-conductivity-type well region and supplied with a fourth potential higher than a third potential, the fourth potential being supplied from a second low voltage power supply using the third potential as a reference;
a first-conductivity-type well region formed adjacent to and around the second second-conductivity-type well region and adjacent to the substrate;
a first-conductivity-type semiconductor region selectively formed in the first-conductivity-type well region;
a first electrode supplied with the first potential and connected to the first-conductivity-type semiconductor region;
a second-conductivity-type semiconductor region selectively formed in the first-conductivity-type well region and separately from the first-conductivity-type semiconductor region, nearer to the second second-conductivity-type well region than to the first-conductivity-type semiconductor region; and
a second electrode supplied with the second potential and connected to the second-conductivity-type semiconductor region.

2. The semiconductor integrated circuit according to claim 1, further comprising:
a third second-conductivity-type well region formed around the second second-conductivity-type well region and between the first-conductivity-type well region and the second second-conductivity-type well region so as to be adjacent to both the first-conductivity-type well region and the second second-conductivity-type well region,
wherein the third second-conductivity-type well region has an impurity concentration lower than that of the second second-conductivity-type well region.

3. The semiconductor integrated circuit according to claim 2, wherein the second electrode is disposed between the third second-conductivity-type region and the first-conductivity-type semiconductor region.

4. The semiconductor integrated circuit according to claim 3, wherein at least one of the impurity concentration of the first-conductivity-type well region and a distance between a pn junction and the second-conductivity-type semiconductor region is set to prevent a depletion layer that has spread from the pn junction, from reaching the second-conductivity-type semiconductor region, said pn junction being formed between the first-conductivity-type well region and the second second-conductivity-type well region.

5. The semiconductor integrated circuit according to claim 2, wherein at least one of the impurity concentration of the first-conductivity-type well region and a distance between a pn junction and the second-conductivity-type semiconductor region is set to prevent a depletion layer that has spread from the pn junction, from reaching the second-conductivity-type semiconductor region, said pn junction being formed between the first-conductivity-type well region and the second second-conductivity-type well region.

6. The semiconductor integrated circuit according to claim 1, wherein the first-conductivity-type well region has an impurity concentration lower than that of the first-conductivity-type semiconductor region.

7. The semiconductor integrated circuit according to claim 1, wherein the first circuit includes a first complementary metal-oxide-semiconductor (CMOS) circuit, and the second circuit includes a second CMOS circuit.

8. The semiconductor integrated circuit according to claim 7, wherein the first CMOS includes a first-conductivity-type channel metal-oxide-semiconductor field-effect transistor (MOSFET) having a source electrode and a drain electrode, and a first second-conductivity-type MOSFET having a source electrode and a drain electrode.

9. The semiconductor integrated circuit according to claim 8, further comprising a capacitor connected between a first terminal through which the first potential is supplied to said source electrode of the first second-conductivity-type MOSFET and a second terminal through which the second potential is supplied to the second electrode.

10. The semiconductor integrated circuit according to claim 1, wherein a pinch resistor is formed in a portion of the first-conductivity-type well region right under the second-conductivity-type semiconductor region whose potential is fixed to the second potential higher than the first potential.

11. The semiconductor integrated circuit according to claim 1, wherein said second-conductivity-type semiconductor region is a first second conductivity-type semiconductor region, further comprising:
a second second-conductivity-type semiconductor region selectively formed in the first-conductivity-type well region and separately from the first-conductivity-type semiconductor region, and formed in a region nearer to the second second-conductivity-type well region than to the first-conductivity-type semiconductor region,
wherein said second second-conductivity-type semiconductor region is connected to the second potential, and disposed in the first-conductivity-type well region in parallel with said first second-conductivity-type semiconductor region.

12. The semiconductor integrated circuit according to claim 1, further comprising a second-conductivity-type buffer region having a shallower diffusion depth than the first-conductivity-type well region, and covering a lower side of the second-conductivity-type semiconductor region.

13. The semiconductor integrated circuit according to claim 12, wherein the second-conductivity-type buffer region is selectively formed in a surface of the first-conductivity-type well region, and the second-conductivity-type semiconductor region is selectively formed inside the second-conductivity-type buffer region.

14. A semiconductor integrated circuit comprising:
a first-conductivity-type semiconductor substrate;
a first second-conductivity-type epitaxial growth layer region formed in one main surface side of the first-conductivity-type semiconductor substrate;
a second second-conductivity-type epitaxial growth layer region, formed in the one main surface side of the substrate and separately from the first second-conductivity-type epitaxial growth layer region;
a first circuit formed in the first second-conductivity-type epitaxial growth layer region and supplied with a second potential higher than a first potential, said second potential being supplied from a first low voltage power supply using the first potential as a reference;
a second circuit formed in the second second-conductivity-type epitaxial growth layer region and supplied with a fourth potential higher than a third potential, said fourth potential being supplied from a second low voltage power supply using the third potential as a reference;
a first-conductivity-type well region formed adjacent to and around the second second-conductivity-type epitaxial growth layer region and adjacent to the substrate;
a first-conductivity-type semiconductor region selectively formed in the first-conductivity-type well region;
a first electrode supplied with the first potential and connected to the first-conductivity-type semiconductor region;
a second-conductivity-type semiconductor region selectively formed in the first-conductivity-type well region and separately from the first-conductivity-type semiconductor region, nearer to the second second-conductivity-type epitaxial growth layer region than to the first-conductivity-type semiconductor region; and
a second electrode supplied with the second potential and connected to the second-conductivity-type semiconductor region.

* * * * *